United States Patent
Kim et al.

(10) Patent No.: US 7,877,063 B2
(45) Date of Patent: Jan. 25, 2011

(54) HIGH-FREQUENCY AMPLIFIER, AND TRANSMISSION/RECEPTION SYSTEM

(75) Inventors: Ryangsu Kim, Osaka (JP); Joji Hayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 635 days.

(21) Appl. No.: 11/918,040

(22) PCT Filed: Apr. 7, 2006

(86) PCT No.: PCT/JP2006/307466
§ 371 (c)(1),
(2), (4) Date: Oct. 9, 2007

(87) PCT Pub. No.: WO2006/109731
PCT Pub. Date: Oct. 19, 2006

(65) Prior Publication Data
US 2008/0247338 A1    Oct. 9, 2008

(51) Int. Cl.
  H04B 1/38     (2006.01)
  H04B 1/44     (2006.01)
  H04J 3/00     (2006.01)
  H03F 3/04     (2006.01)

(52) U.S. Cl. .......................... 455/73; 455/78; 370/280; 330/296

(58) Field of Classification Search .................. None
See application file for complete search history.

(56) References Cited

U.S. PATENT DOCUMENTS 5,590,412 A * 12/1996 Sawai et al. ................... 455/82
5,789,799 A    8/1998 Voinigescu et al. ............ 257/578
5,926,069 A    7/1999 Ko et al. ....................... 330/302
6,002,860 A   12/1999 Voinigescu et al. .... 395/500.35
2003/0155973 A1  8/2003 Doi et al. .................... 330/133

FOREIGN PATENT DOCUMENTS

| JP | 8-148953 | 6/1996 |
| JP | 2002-335187 | 11/2002 |
| JP | 2005-210372 | 8/2005 |
| JP | 2005-313333 | 12/2005 |
| JP | 2005-333313 | 12/2005 |
| WO | WO 02/27920 A1 | 4/2002 |
| WO | WO 02/65996 A2 | 6/2002 |

* cited by examiner

*Primary Examiner*—Matthew D Anderson
*Assistant Examiner*—Gennadiy Tsvey
(74) *Attorney, Agent, or Firm*—Steptoe & Johnson, LLP

(57) ABSTRACT

In a high-frequency amplifier for amplifying transmission and reception signals, an integrated circuit area is reduced to reduce production costs. A high-frequency amplifier (101) includes a reception signal amplifying part (102), a transmission signal amplifying part (103), and a spiral inductor (104). An output of the reception signal amplifying part (102) is connected with an output of the transmission signal amplifying part (103) to be an output terminal OUT of the high-frequency amplifier (101). The single spiral inductor (104) is connected to the output terminal OUT. This spiral inductor (104) is used as a load common to the reception signal amplifying part (102) and the transmission signal amplifying part (103). Thereby, the area of the integrated circuit is reduced, and the production cost is reduced.

20 Claims, 18 Drawing Sheets

HIGH-FREQUENCY AMPLIFIER, AND TRANSMISSION/RECEPTION SYSTEM

The present application is based on International Application PCT/JP2006/307466, filed Apr. 7, 2006, which claims priority to Japanese Patent Application No. 2005-112429, filed Apr. 8, 2005, the entire contents of which are hereby incorporated by reference.

TECHNICAL FIELD

The present invention relates to a high-frequency amplifier for amplifying a reception signal and a transmission signal, and more particularly, to a small-area and low-cost high-frequency amplifier, and a transmission/reception system such as a handy phone in which the high-frequency amplifier is embedded.

BACKGROUND ART

In mobile communication systems, there is an increasing demand for a high-frequency signal processing integrated circuit which is directed to time division duplex (TDD) systems, such as wireless LAN, Bluetooth (trademark), and PHS (Personal Handyphone System), which perform reception and transmission of radio signals in separated time zones.

The above-mentioned mobile communication systems are required to realize reductions in spaces and costs of integrated circuits because miniaturization and cost reduction of mobile communication devices enhance popularization and convenience of the communication systems.

Currently, a front-end one-chip integrated circuit for processing communication signals from RF frequency to baseband frequency is realized. FIG. 11 shows the construction of a high-frequency amplifier for amplifying transmission and reception signals, which is included in the conventional integrated circuit.

With reference to FIG. 11, a high-frequency amplifier 1101 includes a low-noise amplifier 1102 and a power amplifier 1103. The low-noise amplifier 1102 amplifies a reception signal. The power amplifier 1103 amplifies a transmission signal. Transistors 1104 and 1105 are provided in the low-noise amplifier 1102 and the power amplifier 1103, respectively. Spiral inductors 1106 and 1107 are provided in the low-noise amplifier 1102 and the power amplifier 1103, respectively.

The transistors 1104 and 1105 are supplied with a DC power supply VDD through the spiral inductors 1106 and 1107, respectively.

A gate of the transistor 1104 is connected to a reception signal input terminal $IN_{RX}$ and to an end of a resistor R1. Another end of the resistor R1 is connected to a common terminal of a transmission/reception selector switch SW1. One of two terminals of the switch SW1 is connected to ground that is shown by "∇" in FIG. 11, while the other terminal is connected to a positive side power supply terminal of a DC power supply Vbias1. A gate of the transistor 1105 is connected to a transmission signal input terminal $IN_{TX}$ and to an end of a resistor R2. Another end of the resistor R2 is connected to a common terminal of a transmission/reception selector switch SW2. One of two terminals of the switch SW2 is connected to ground that is shown by "∇" in FIG. 11, while the other terminal is connected to a positive side power supply terminal of a DC power supply Vbias2.

Negative side power supply terminals of the DC power supplies Vbias1 and Vbias2 are connected to the ground. Further, sources of the transistors 1104 and 1105 are connected to the ground.

Next, a description will be given of the fundamental operation of the high-frequency amplifier 1101 in the reception mode and the transmission mode.

During the reception mode, a transmission/reception switching signal is input to a transmission/reception switching control terminal S1 and to a transmission/reception switching control terminal S2. At this time, the transmission/reception selector switch SW1 is connected to the terminal on the DC power supply Vbias1 side, and thereby the low-noise amplifier 1102 turns on. On the other hand, the transmission/reception selector switch SW2 is connected to the terminal on the ground side, and thereby the power amplifier 1103 turns off. The turned-on low-noise amplifier 1102 amplifies the reception signal inputted to the reception signal input terminal $IN_{RX}$, and outputs the signal to an output terminal $OUT_{RX}$.

Further, during the transmission mode, the transmission/reception switching signal is input to the transmission/reception switching control terminal S1 and to the transmission/reception switching control terminal S2. At this time, the transmission/reception selector switch SW1 is connected to the ground terminal, and thereby the low-noise amplifier 1102 turns off. On the other hand, the transmission/reception selector switch SW2 is connected to the DC power supply Vbias2, and thereby the power amplifier 1103 turns on. The turned-on power amplifier 1103 amplifies the transmission signal inputted to the transmission signal input terminal $IN_{TX}$, and outputs the signal to an output terminal $OUT_{TX}$.

In the conventional high-frequency amplifier, the spiral inductors fabricated in the integrated circuit are used as loads of the low-noise amplifier and the power amplifier, respectively (for example, refer to Patent Documents 1 and 2).

The reason is as follows. If the inductors are disposed outside the integrated circuit, inductances of bonding wires and board wirings are parasitic on the inductors, and capacitances of ESD (electro-static discharge) protection elements and pads are parasitic on the inductors, and consequently, it becomes difficult to oscillate the loads of the amplifiers at desired frequencies.

Patent Document 1: Japanese Published Patent Application No. Hei. 10-126174 (Page 20, FIG. 14)

Patent Document 2: Japanese Unexamined Patent Publication No. 2004-516737 (Page 10, FIG. 1)

Problems to be Solved by the Invention

By the way, a spiral inductors in an integrated circuit occupies a larger area than other elements to obtain a desired inductance and a largest possible Q value. In the conventional high-frequency amplifier shown in FIG. 11, the two amplifiers use at least two spiral inductors 1106 and 1107 as loads.

FIG. 12(a) shows a rough layout of the high-frequency amplifier shown in FIG. 11 which is fabricated in an ordinary CMOS process. In FIG. 12(a), the same reference numerals as those shown in FIG. 11 denote the same elements. This spiral inductor is fabricated in a three-layer wiring process.

An area A of the spiral inductor 1107 is constituted as shown in FIG. 12(b). That is, conductor patterns 1107a and 1107c of an uppermost wiring layer formed on a surface of a first interlayer isolation film iso1 are connected to a conductor pattern 1107d of an intermediate wiring layer formed on a surface of a second interlayer isolation film iso2 via conductors filled in via-holes vh1 and vh2, and the conductor patterns 1107a and 1107c sterically intersect with a conductor pattern 1107b formed on the surface of the first interlayer isolation film iso1.

Further, in FIG. 12(a), a portion sandwiched by the upper-half power amplifier 1103 and the lower-half low-noise amplifier 1102 corresponds to the sources of the transistors 1105 and 1104, i.e., the ground GND.

In this layout, the area occupied by the two spiral inductors each having an inductance of 6 nH is 0.32 mm$^2$, while the area of the entire layout of the high-frequency amplifier 1101 is 0.60 mm$^2$. Accordingly, the two spiral inductors occupy 53% of the whole layout area.

Generally, the above-mentioned amplifiers are multistage-connected to obtain a high gain. Assuming that the number of stages of the low-noise amplifiers is m and the number of stages of the power amplifiers is n (m,n: positive integers) in this multistage connection, the number of spiral inductors becomes m+n. When the low-noise amplifiers and the power amplifiers are constructed by differential type amplifiers, the number of spiral inductors becomes 2(m+n).

As a result, the area of the integrated circuit increases, and the cost also increases.

It is generally known that miniaturization of an integrated circuit leads to a reduction in production cost of a semiconductor chip as well as a reduction in a semiconductor chip mounting area.

The present invention is made to solve the above-mentioned problems and has for its object to provide a high-frequency amplifier for amplifying transmission and reception signals, which miniaturizes the area of an integrated circuit in which the amplifier is mounted, and reduces the production cost of the integrated circuit, and a transmission/reception system including the high-frequency amplifier.

Measures to Solve the Problems

According to Claim 1 of the present invention, there is provided a high-frequency amplifier including a reception signal amplifying part, a transmission signal amplifying part, and an inductor; wherein the reception signal amplifying part has a reception signal input terminal, and a first transmission/reception switching control terminal; the transmission signal amplifying part has a transmission signal input terminal, and a second transmission/reception switching control terminal; a common output terminal to which an output of the reception signal amplifying part and an output of the transmission signal amplifying part are connected is provided; switching of operations of the reception signal amplifying part and the transmission signal amplifying part is carried out such that, during a reception mode, control signals are input to the first transmission/reception switching control terminal and to the second transmission/reception switching control terminal, whereby the transmission signal amplifying part is turned off and the reception signal amplifying part is turned on to amplify a reception signal that is inputted from the reception signal input terminal, and during a transmission mode, control signals are input to the first transmission/reception switching control terminal and to the second transmission/reception switching control terminal, whereby the reception signal amplifying part is turned off and the transmission signal amplifying part is turned on to amplify a transmission signal that is inputted from the transmission signal input terminal; and the inductor is connected between a DC power supply terminal and the output terminal as a load that is common to the reception signal amplifying part and the transmission signal amplifying part.

According to the high-frequency amplifier of Claim 1, the reception signal amplifying part is turned on during the reception mode, while the transmission signal amplifying part is turned on during the transmission mode. Therefore, a single inductor can be used as a load that is common to the reception signal amplifying part and the transmission signal amplifying part.

According to Claim 2 of the present invention, there is provided a high-frequency amplifier including a reception signal amplifying part, a transmission signal amplifying part, an inductor, and a transistor; wherein the reception signal amplifying part has a reception signal input terminal, and a first transmission/reception switching control terminal; the transmission signal amplifying part has a transmission signal input terminal, and a second transmission/reception switching control terminal; an output of the reception signal amplifying part and an output of the transmission signal amplifying part are connected to the transistor; switching of operations of the reception signal amplifying part and the transmission signal amplifying part is carried out such that, during a reception mode, control signals are input to the first transmission/reception switching control terminal and to the second transmission/reception switching control terminal, whereby the transmission signal amplifying part is turned off, and the reception signal amplifying part is turned on to amplify a reception signal that is inputted from the reception signal input terminal, and during a transmission mode, control signals are input to the first transmission/reception switching control terminal and to the second transmission/reception switching control terminal, whereby the reception signal amplifying part is turned off, and the transmission signal amplifying part is turned on to amplify a transmission signal that is inputted from the transmission signal input terminal; the inductor is connected between a DC power supply terminal and the transistor as a load that is common to the reception signal amplifying part and the transmission signal amplifying part; and an output terminal is provided at a connection point of the inductor and the transistor.

According to the high-frequency amplifier of Claim 2, cascade transistors are provided between the inductor and the outputs of the reception signal amplifying part and the transmission signal amplifying part, respectively, and the reception signal amplifying part is turned on during the reception mode, while the transmission signal amplifying part is turned on during the transmission mode. Therefore, a single inductor can be used as a load that is common to the reception signal amplifying part and the transmission signal amplifying part, thereby reducing a parasitic capacitance at the output terminal.

According to Claim 3 of the present invention, the high-frequency amplifier defined in Claim 1 or 2 further includes a switch and a transmission signal output terminal; the switch is connected between the output terminal and the transmission signal output terminal; during the reception mode, the switch is turned off, whereby the reception signal inputted from the reception signal input terminal is amplified and transmitted to the output terminal; and during the transmission mode, the switch is turned on, whereby the transmission signal inputted from the transmission signal input terminal is amplified and transmitted to the transmission signal output terminal.

According to the high-frequency amplifier of Claim 3, since the output terminals exclusively for the transmission mode and the reception mode are provided, the reception signal amplified during the reception mode is prevented from leaking to an antenna.

According to Claim 4 of the present invention, in the high-frequency amplifier defined in Claim 1 or 2, the reception signal amplifying part has a transistor for amplifying the reception signal.

According to the high-frequency amplifier of Claim 4, in the high-frequency amplifier defined in Claim 1 or 2, the reception signal amplifying part may be constituted so as to have a transistor for amplifying the reception signal.

According to Claim 5 of the present invention, in the high-frequency amplifier defined in Claim 4, the transistor of the reception signal amplifying part is optimized to realize noise matching.

According to the high-frequency amplifier of Claim 5, in the high-frequency amplifier defined in Claim 4, the transistor of the reception signal amplifying part may be optimized to realize noise matching.

According to Claim 6 of the present invention, in the high-frequency amplifier defined in Claim 4, the transistor of the reception signal amplifying part is optimized to realize gain matching.

According to the high-frequency amplifier of Claim 6, in the high-frequency amplifier defined in Claim 4, the transistor of the reception signal amplifying part may be optimized to realize gain matching.

According to Claim 7 of the present invention, in the high-frequency amplifier defined in Claim 1 or 2, the transmission signal amplifying part has a transistor for amplifying power.

According to the high-frequency amplifier of Claim 7, in the high-frequency amplifier defined in Claim 1 or 2, the transmission signal amplifying part may have a transistor for amplifying power.

According to Claim 8 of the present invention, in the high-frequency amplifier defined in Claim 1 or 2, the inductor comprises a spiral inductor that is mounted in an integrated circuit.

According to the high-frequency amplifier of Claim 8, the space occupied by the inductor in the integrated circuit can be reduced.

According to Claim 9 of the present invention, in the high-frequency amplifier defined in Claim 1 or 2, the reception signal amplifying part, the transmission signal amplifying part, and the inductor are mounted on the same integrated circuit.

According to the high-frequency amplifier of Claim 9, in the high-frequency amplifier defined in Claim 1 or 2, a single inductor to be a load that is common to the reception signal amplifying part and the transmission signal amplifying part is provided, and the reception signal amplifying part, the transmission signal amplifying part, and the inductor are mounted on the same integrated circuit. Therefore, the space occupied by the inductor in the integrated circuit can be reduced, thereby reducing the scale of the integrated circuit.

According to Claim 10 of the present invention, in the high-frequency amplifier defined in Claim 1 or 2, the inductor comprises a spiral inductor that is mounted in a module.

According to the high-frequency amplifier of Claim 10, the space occupied by the inductor in the module can be reduced.

According to Claim 11 of the present invention, there is provided a high-frequency amplifier comprising two pieces of high-frequency amplifiers defined in Claim 1 or 2, and the amplifiers amplify a differential reception signal and a differential transmission signal, respectively.

According to the high-frequency amplifier of Claim 11, two pieces of high-frequency amplifiers defined in Claim 1 or 2 may be provided to amplify a differential reception signal and a differential transmission signal, respectively.

According to Claim 12 of the present invention, in the high-frequency amplifier defined in Claim 1 or 2, each of transistors constituting the high-frequency amplifier is any of a MOSFET, a MESFET, a JFET, a HEMT, a bipolar junction transistor, and a heterojunction transistor, or a combination of some of these transistors.

According to the high-frequency amplifier of Claim 12, each of the transistors constituting the high-frequency amplifier defined in Claim 1 or 2 may be any of a MOSFET, a MESFET, a JFET, a HEMT, a bipolar junction transistor, and a heterojunction transistor, or a combination of some of these transistors.

According to Claim 13 of the present invention, in the high-frequency amplifier defined in Claim 1 or 2, each of transistors constituting the high-frequency amplifier comprises any of silicon, silicon-germanium, and III-V compound semiconductor.

According to the high-frequency amplifier of Claim 13, each of the transistors constituting the high-frequency amplifier defined in Claim 1 or 2 may comprise any of silicon, silicon-germanium, and III-V compound semiconductor.

According to Claim 14 of the present invention, in the high-frequency amplifier defined in Claims 1 or 2, the reception signal amplifying part has a transistor for amplifying the reception signal, and a first variable voltage supply that can vary a voltage applied between a gate of the transistor and the ground; the transmission signal amplifying part has a transistor for amplifying power, and a second variable voltage supply that can vary a voltage applied to a gate of the transistor and the ground; the first transmission/reception switching control terminal is connected to the first variable voltage supply; the second transmission/reception switching control terminal is connected to the second variable voltage supply; during the reception mode, control signals are input to the first transmission/reception switching control terminal and to the second transmission/reception switching control terminal, whereby the transmission signal amplifying part is almost turned off, and the reception signal amplifying part is turned on to amplify the reception signal inputted from the reception signal input terminal at low noise.

According to the high-frequency amplifier of Claim 14, it is possible to amplify the reception signal at low noise by not only turning on the reception signal amplifying part during the reception mode but also setting the transmission signal amplifying part in the on state that is almost close to the off state.

According to Claim 15 of the present invention, the high-frequency amplifier defined in Claim 1 or 2 further includes a switch disposed between the output terminal and the reception signal input terminal, and the switch is turned on when the reception signal has a large amplitude.

According to the high-frequency amplifier of Claim 15, when a reception signal of a large amplitude is inputted, the switch is turned on and the reception signal passes through the high-frequency amplifier without being amplified in the amplifier, whereby saturation of the reception signal can be suppressed.

According to Claim 16 of the present invention, in the high-frequency amplifier defined in Claim 1 or 2, when a capacitance that is required between the output terminal and the ground by the high-frequency amplifier is deficient due to a parasitic capacitance at the output terminal, a capacitance having a capacitance value corresponding to the deficit is connected.

According to the high-frequency amplifier of Claim 16, when a capacitance required by the high-frequency amplifier is deficient due to the parasitic capacitance, a capacitance equivalent to the deficit is added, whereby the high-frequency amplifier can have the predetermined capacitance.

According to Claim 17 of the present invention, the high-frequency amplifier defined in Claim 1 or 2 further includes switches disposed between the reception signal input terminal, the transmission signal input terminal and the ground, respectively, and the switch which is disposed at the side where the reception signal amplifying part or the transmission signal amplifying part is turned off, is turned on.

According to the high-frequency amplifier of Claim 17, since the signal input terminal of either the reception signal amplifying part or the transmission signal amplifying part, which is desired to be turned off, is grounded, amplification of the reception signal or the transmission signal by the reception signal amplifying part or the transmission signal amplifying part can be reliably turned off.

According to Claim 18 of the present invention, the high-frequency amplifier defined in Claim 1 or 2 further includes a switch, an input/output terminal, and first and second capacitances; a series-connected body comprising said switch and said first capacitance is connected between a node to which the output terminal is connected, and the input/output terminal; the input/output terminal is connected through the second capacitance to a node to which the transmission signal input terminal should be connected; during the reception mode, said switch is turned off, and the reception signal inputted to the input/output terminal is amplified and transmitted to the output terminal; and during the transmission mode, said switch is turned on, and the transmission signal inputted from the transmission signal input terminal is amplified and transmitted to the input/output terminal.

According to the high-frequency amplifier of Claim 18, the output terminal for the amplified transmission signal and the input terminal for the reception signal can be consolidated to an input/output terminal.

According to Claim 19 of the present invention, there is provided a transmission/reception system having a transmission/reception unit for transmitting and receiving a high-frequency signal, which system includes a high-frequency amplifier defined in Claim 1 or 2 and operates according to a time-division duplex communication scheme.

According to the transmission/reception system of Claim 19, the system having a transmission/reception unit for transmitting and receiving a high-frequency signal includes the high-frequency amplifier defined in Claim 1 or 2, and operates according to the time-division duplex communication scheme. Therefore, the transmission/reception unit can share the same inductor.

According to Claim 20 of the present invention, there is provided a transmission/reception system having a transmission/reception unit for transmitting and receiving a high-frequency signal, which system includes a plurality of high-frequency amplifiers defined in Claim 1 or 2, and is capable of setting whether the plural high-frequency amplifiers are simultaneously switched between the transmission mode and the reception mode, or some of them are in the transmission mode while the others are in the reception mode.

According to the transmission/reception system of Claim 20, the same transmission/reception system can be used as either a MIMO transceiver or an FDD transceiver by changing the setting.

EFFECTS OF THE INVENTION

According to the present invention, in a high-frequency amplifier for amplifying a reception signal and a transmission signal, only one spiral inductor is used as a load of the amplifier, thereby realizing a small-area and low-cost high-frequency amplifier.

Further, the high-frequency amplifier is constituted such that, during the reception mode, the reception signal amplifying part is turned on and the transmission signal amplifying part is set in an on state that is almost close to off, thereby realizing low-noise amplification for the reception signal.

Further, in a transmission/reception system including a high-frequency amplifier for amplifying a reception signal and a transmission signal, the high-frequency amplifier is constituted so as to include only one spiral inductor to be used as a load, thereby realizing a small-area and low-cost transmission/reception system.

Furthermore, the transmission/reception system includes a plurality of high-frequency amplifiers for amplifying a reception signal and a transmission signal, each having only one spiral inductor to be used as a load, and the system is able to set whether the plural high-frequency amplifiers are simultaneously switched between the transmission mode and the reception mode, or some of them are in the transmission mode while the others are in the reception mode. Therefore, the single transmission/reception system can be used as either a MIMO transceiver or an FDD transceiver.

DESCRIPTION OF REFERENCE NUMERALS

Figure 1:
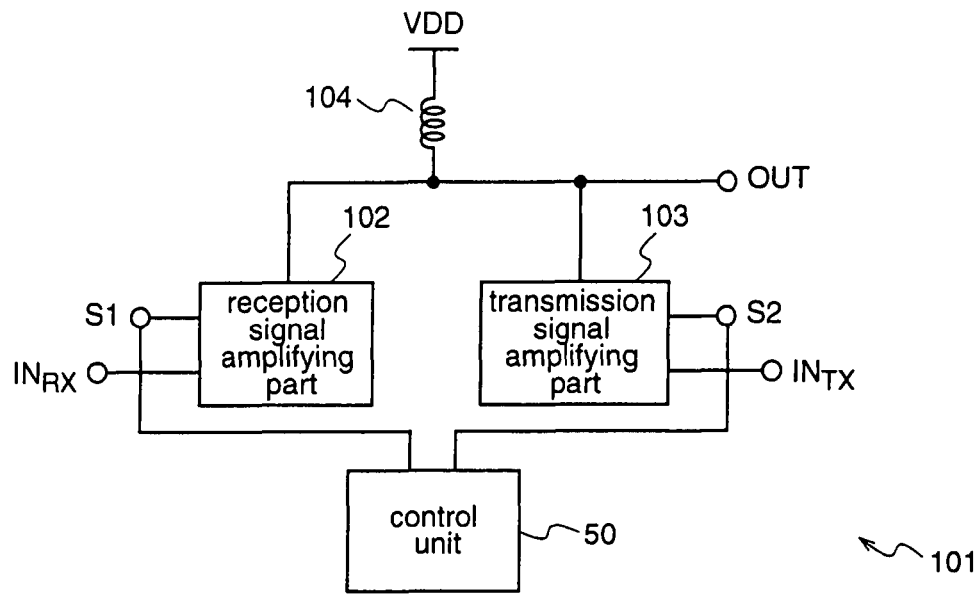
FIG. 1 is a diagram illustrating the construction of a high-frequency amplifier 101 according to a first embodiment of the present invention.

50 . . . control unit
70 . . . reception signal amplitude detection unit
101, 101a, 101b, 101c, 501, 501a, 501b, 501c, 501d, 501f, 501g, 501g1, 1101, 1301, 1301a, 1301b . . . high-frequency amplifier
102, 1302a, 1302b . . . reception signal amplifying part
103, 1303a, 1303b . . . transmission signal amplifying part
104, 1106, 1107, 1304a, 1304b . . . spiral inductor
201, 202, 301, 302, 303, 304, 502, 502a, 502b, 601, 602, 801, 801a, 801b, 802, 802a, 802b, 1104, 1105 . . . transistor
901, 901a, 901b, 1401a, 1401b . . . transmission/reception system
901d . . . package
902, 902a, 902b, 1001 . . . transmission/reception integrated circuit for communication
903, 903a, 903b . . . antenna
904, 904a, 904b . . . RF filter
905, 905a, 905b, 1002, 1003 . . . transmission/reception selector switch
906, 906a, 906b . . . input matching circuit
907, 907a, 907b . . . output matching circuit
908, 908a, 908b . . . reception mixer
909, 909a, 909b . . . transmission mixer
910, 910a, 910b . . . frequency synthesizer
911, 911a, 911b . . . reception filter
912, 912a, 912b . . . transmission filter
913, 913a, 913b . . . A/D converter
914, 914a, 914b . . . D/A converter
915, 915a, 915b, 915d . . . digital signal processor
1102 . . . low-noise amplifier
1103 . . . power amplifier
$IN_{RX}$, $IN_{RXa}$, $IN_{RXb}$ . . . reception signal input terminal
$IN_{TX}$, $IN_{TXa}$, $IN_{TXb}$ . . . transmission signal input terminal
S1, S1a, S1b, S2, S2a, S2b . . . transmission/reception switching control terminal
OUT, OUTa, OUTb, $OUT_{RX}$, $OUT_{RXa}$, $OUT_{RXb}$ . . . output terminal
VDD . . . DC power supply
Sw1, Sw1a, Sw1b, SW2, SW2a, SW2b, SW3, SW4, SW5, SW5a, SW5b, SW6, SW7, SW8 . . . switch
$OUT_{TX}$, $OUT_{TXa}$, $OUT_{TXb}$ . . . transmission signal output terminal
CF . . . parasitic capacitance
Vc . . . variable capacitance element
Vvr1, Vvr2 . . . variable voltage supply
CA, CA1, CA2, CA3 . . . capacitance
SA1, SA2, SA3 . . . switch
R1, R2 . . . resistor
Vbias1, Vbias2 . . . DC power supply

BEST MODE TO EXECUTE THE INVENTION

Hereinafter, embodiments of the present invention will be described with reference to the drawings.

Embodiment 1

FIG. 1 shows the construction of a high-frequency amplifier 101 according to a first embodiment of the present invention.

In FIG. 1, the high-frequency amplifier 101 includes a reception signal amplifying part 102, a transmission signal amplifying part 103, a spiral inductor 104, and an output terminal OUT.

The reception signal amplifying part 102 includes a transmission/reception switching control terminal S1, and a reception signal input terminal $IN_{RX}$. The transmission signal amplifying part 103 includes a transmission/reception switching control terminal S2, and a transmission signal input terminal $IN_{TX}$. The reception signal amplifying part 102 and the transmission signal amplifying part 103 are supplied with a DC power supply VDD via the same spiral inductor 104.

The output terminal OUT is connected to a node of the spiral inductor 104 on the opposite side from the DC power supply VDD.

During the reception mode, transmission/reception switching control signals from a control unit 50 are applied to the transmission/reception switching control terminal S1 and to the transmission/reception switching control terminal S2, whereby the reception signal amplifying part 102 is turned on while the transmission signal amplifying part 103 is turned off.

A reception signal is input through the reception signal input terminal $IN_{RX}$, and the reception signal amplifying part 102 amplifies the reception signal with the spiral inductor 104 being a load, and outputs the amplified signal to the output terminal OUT which is common for the transmission and reception modes.

Conversely, during the transmission mode, transmission/reception switching control signals are applied to the transmission/reception switching control terminal S1 and to the transmission/reception switching control terminal S2, whereby the reception signal amplifying part 102 is turned off while the transmission signal amplifying part 103 is turned on. A transmission signal is input through the transmission signal input terminal $IN_{TX}$, and the transmission signal amplifying part 103 amplifies the transmission signal with the spiral inductor 104 being a load, and outputs the amplified signal to the output terminal OUT which is common for the transmission and reception modes.

Time-division duplex communication is achieved by alternately performing the reception mode and the transmission mode.

During the respective modes, the spiral inductor 104 functions as a load that is common to the reception signal amplifying part 102 and the transmission signal amplifying part 103.

Figure 11:
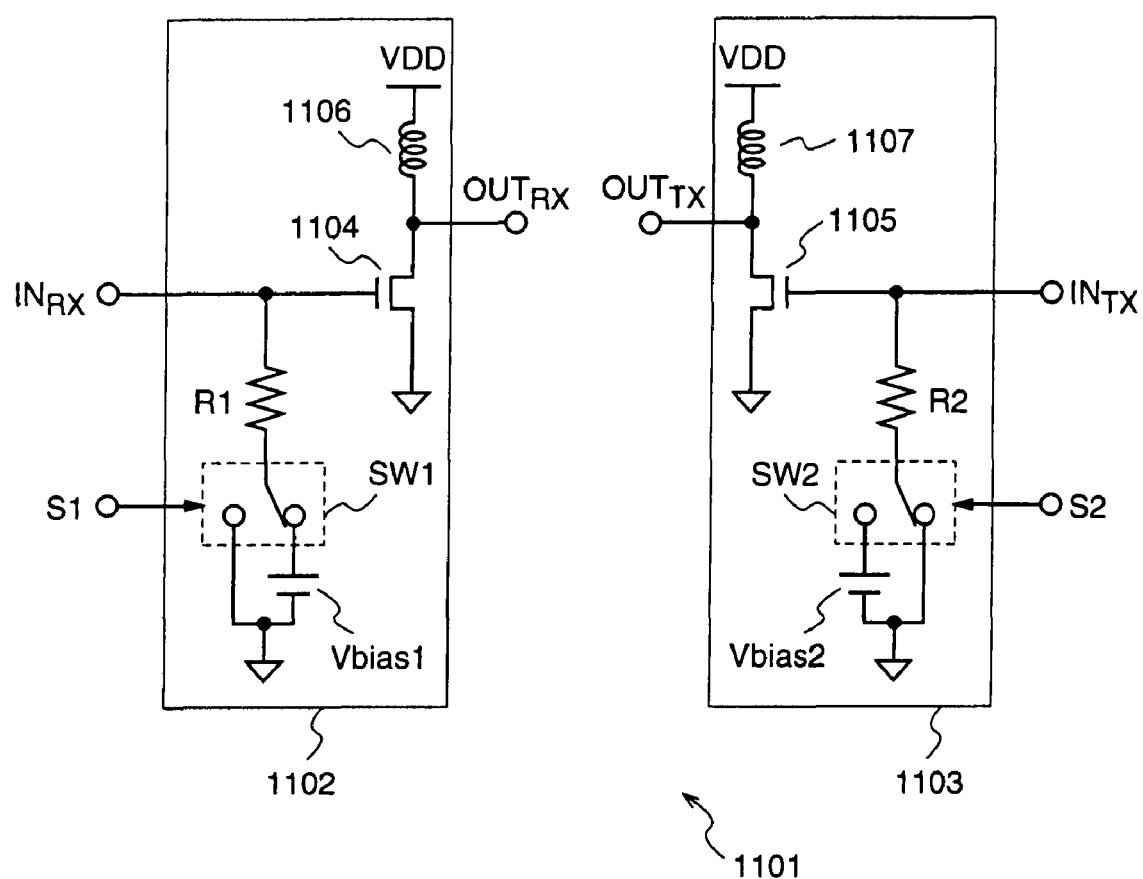
FIG. 11 is a diagram illustrating the construction of a conventional high-frequency amplifier 1101.

Therefore, only one spiral inductor is provided in this first embodiment while two spiral inductors are required in the conventional high-frequency amplifier 1101 shown in FIG. 11. Thereby, the area of the integrated circuit is reduced, and the production cost thereof is also reduced.

A resonance frequency of the load of the high-frequency amplifier 101 is determined according to a capacitance $C_{POUT}$ at the output terminal OUT, and the value of an inductance L of the spiral inductor 104.

The capacitance $C_{POUT}$ at the output terminal OUT is expressed by a sum of a parasitic capacitance $C_{PRX}$ in the output of the reception signal amplifying part 102, a parasitic capacitance $C_{PTX}$ in the output of the transmission signal amplifying part 103, an external load capacitance $C_{PL}$ of the high-frequency amplifier 101 connected to the output terminal OUT, and a parasitic capacitance $C_{PIND}$ of the spiral inductor 104. That is, $$CP_{OUT} = C_{PRX} + C_{PTX} + C_{PL} + C_{PIND}$$

Accordingly, the resonance frequency $f_0$ of the load of the high-frequency amplifier 101 is expressed by $$f_0 = 1/(2\pi(LC_{POUT})^{0.5})$$

Figure 2:
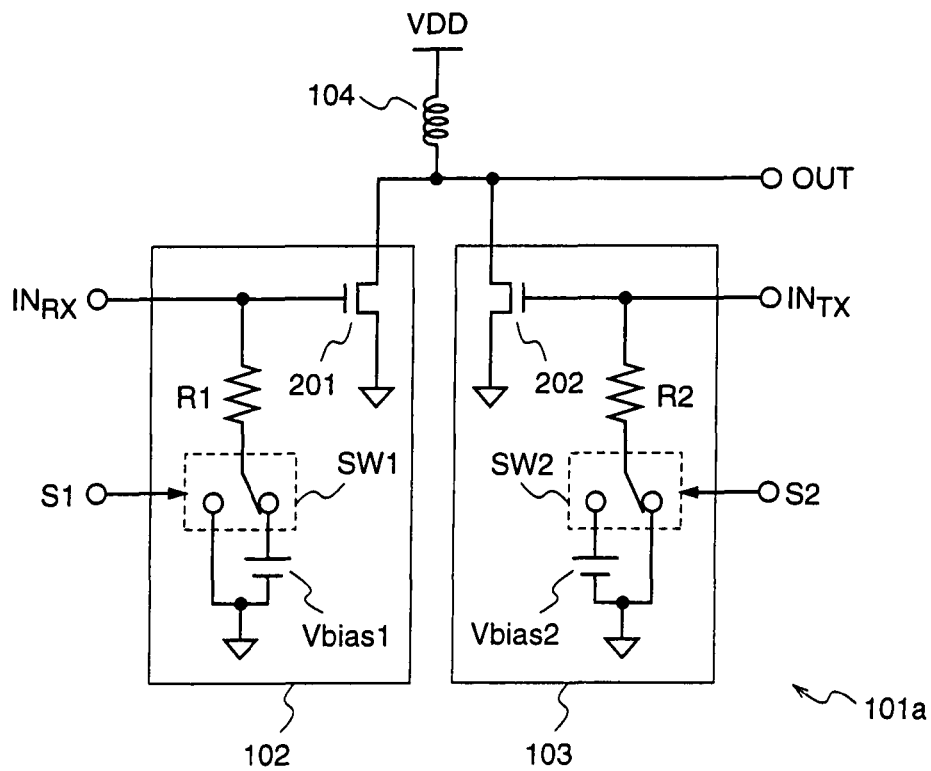
FIG. 2 is a diagram illustrating the construction of a high-frequency amplifier 101 as a first example of the first embodiment.

FIG. 2 shows the construction of a high-frequency amplifier 101a which is a first example of the high-frequency amplifier 101 of the first embodiment.

With reference to FIG. 2, in the high-frequency amplifier 101a, the constructions of the reception signal amplifying part 102 and the transmission signal amplifying part 103 of the high-frequency amplifier 101 shown in FIG. 1 are implemented by transistors 201 and 202, resistors R1 and R2, switches SW1 and SW2, and DC power supplies Vbias1 and Vbias2, respectively.

Hereinafter, it is assumed an N channel MOSFET (hereinafter referred to as "NMOSFET") is used as each transistor. A drain of the transistor 201 is connected to one end of the spiral inductor 104, the output terminal OUT, and a drain of the transistor 202. Sources of the transistors 201 and 202 are connected to the ground. The other end of the spiral inductor 104 is connected to the DC current source VDD.

A gate of the transistor 201 is connected to the reception signal input terminal $IN_{RX}$ of the high-frequency amplifier 101a. The gate of the transistor 201 is also connected to a common terminal of the transmission/reception selector switch SW1 through the resistor R1. One of two terminals of the switch SW1 is connected to the ground, while the other end is connected to the positive side power supply terminal of the DC power supply Vbias1.

A gate of the transistor 202 is connected to the transmission signal input terminal $IN_{TX}$ of the high-frequency amplifier 101a. The gate of the transistor 202 is also connected to a common terminal of the transmission/reception selector switch SW2 through the resistor R2. One of two terminals of the switch SW2 is connected to the ground, while the other end is connected to the positive side power supply terminal of the DC power supply Vbias2.

The negative side power supply terminals of the DC power supplies Vbias1 and Vbias2 are connected to the ground.

In the reception mode, transmission/reception switching control signals from the control unit 50 shown in FIG. 1 are input to the transmission/reception switching control terminal S1 and to the transmission/reception switching control terminal S2, and the switch SW1 is connected to the terminal on the bias DC power supply Vbias1 side, and thereby the transistor 201 turns on, while the switch SW2 is connected to the terminal on the ground side, and thereby the transistor 202 turns off. Thereby, only the reception signal amplifying part (low-noise amplifier) 102 is turned on.

In the transmission mode, the states of the switches SW1 and SW2 and the states of the transistors 201 and 202 are exchanged, respectively. Thereby, only the transmission signal amplifying part (power amplifier) 103 is turned on. The transmission/reception selector switches SW1 and SW2 may have other constructions than those mentioned above so long as they can turn on and off the transistors 201 and 202.

Figure 3A:
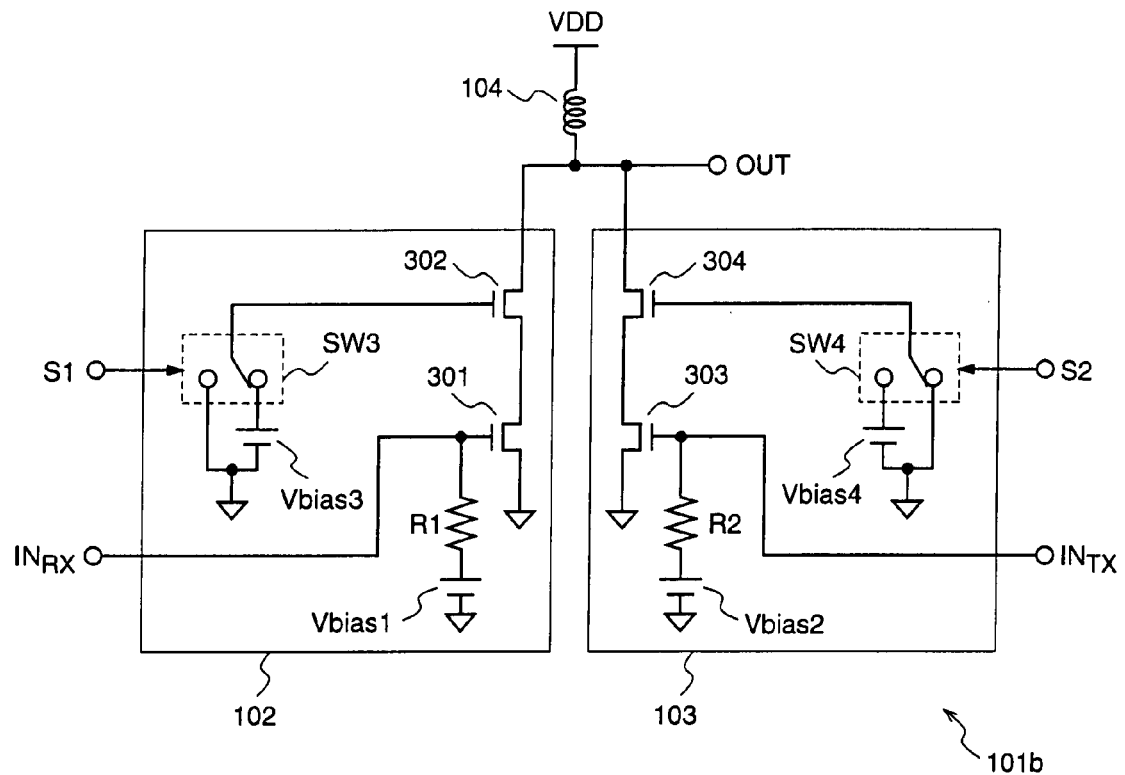
FIG. 3(a) is a diagram illustrating the circuit construction of the entirety of a high-frequency amplifier 101b as a second example of the first embodiment.
Figure 3B:
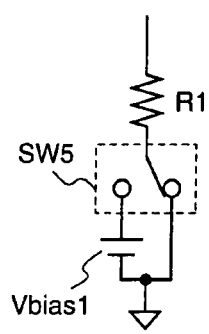
FIG. 3(b) is a diagram illustrating a switch for short-circuiting which is provided at a DC power supply of the high-frequency amplifier 101b according to the first embodiment.

FIG. 3 shows the construction of a high-frequency amplifier 101b as a second example of the high-frequency amplifier 101 according to the second embodiment.

With reference to FIG. 3(a), in the high-frequency amplifier 101b, the constructions of the reception signal amplifying part 102 and the transmission signal amplifying part 103 of the high-frequency amplifier 101 shown in FIG. 1 are implemented by NMOS transistors 301, 302, 303, and 304, resistors R1 and R2, switches SW3 and SW4, and DC power supplies Vbias1, Vbias2, Vbias3, and Vbias4, respectively.

A drain of the transistor 301 is connected to a source of the transistor 302. A gate of the transistor 301 is connected to the reception signal input terminal $IN_{RX}$ of the high-frequency amplifier 101b. The gate of the transistor 301 is also connected to the positive side power supply terminal of the DC power supply Vbias1 via the resistor R1. A source of the transistor 301 is connected to the ground.

A drain of the transistor 302 is connected to an end of the spiral inductor 104, the output terminal OUT, and a drain of the transistor 304. A gate of the transistor 302 is connected to a common terminal of the transmission/reception selector switch SW3. One of two terminals of the switch SW3 is connected to the ground, while the other terminal is connected to the positive side power supply terminal of the DC current supply Vbias3. The other end of the spiral inductor 104 is connected to the DC power supply VDD.

Similarly, a drain of the transistor 303 is connected to a source of the transistor 304. A gate of the transistor 303 is connected to the transmission signal input terminal $IN_{TX}$ of the high-frequency amplifier 101b. The gate of the transistor 303 is also connected to the positive side power supply terminal of the DC power supply Vbias2 via the resistor R2. A source of the transistor 303 is connected to the ground.

A gate of the transistor 304 is connected to a common terminal of the transmission/reception selector switch SW4. One of two terminals of the switch SW4 is connected to the ground, while the other end is connected to the positive side power supply terminal of the DC power supply Vbias4.

The negative side power supply terminals of the DC power supplies Vbias1, Vbias2, Vbias3, and Vbias4 are grounded.

In the reception mode, transmission/reception switching control signals from the control unit 50 shown in FIG. 1 are input to the transmission/reception switching control terminal S1 and to the transmission/reception switching control terminal S2, whereby the switch SW3 is connected to the terminal on the bias DC power supply Vbias3 side, and thereby the transistor 302 turns on, while the switch SW4 is connected to the terminal on the ground side, and thereby the transistor 304 turns off.

During the transmission mode, the states of the switches SW3 and SW4 and the states of the transistors 302 and 304 are exchanged, respectively.

The high-frequency amplifier 101*b* shown in FIG. 3 is different from the high-frequency amplifier 101*a* shown in FIG. 2 in that the transistors of the reception signal amplifying part 102 (transmission signal amplifying part 103) are cascade type transistors, and the transmission/reception selector switches SW3 and SW4 are connected to the gates of the cascade transistors, respectively.

In the high-frequency amplifier 101*b*, only either the transistors of the reception signal amplifying part 102 or the transistors of the transmission signal amplifying part 103 may be cascade type transistors.

Further, as shown in FIG. 3(*b*), a switch SW5 may be disposed between the resistor R1 and the DC power supply Vbias1 that biases the gate of the transistor 301 to make the bias voltage zero when the transistor 301 is turned off. Further, a switch similar to the switch SW5 may be disposed on the transistor 303 side.

Figure 4:
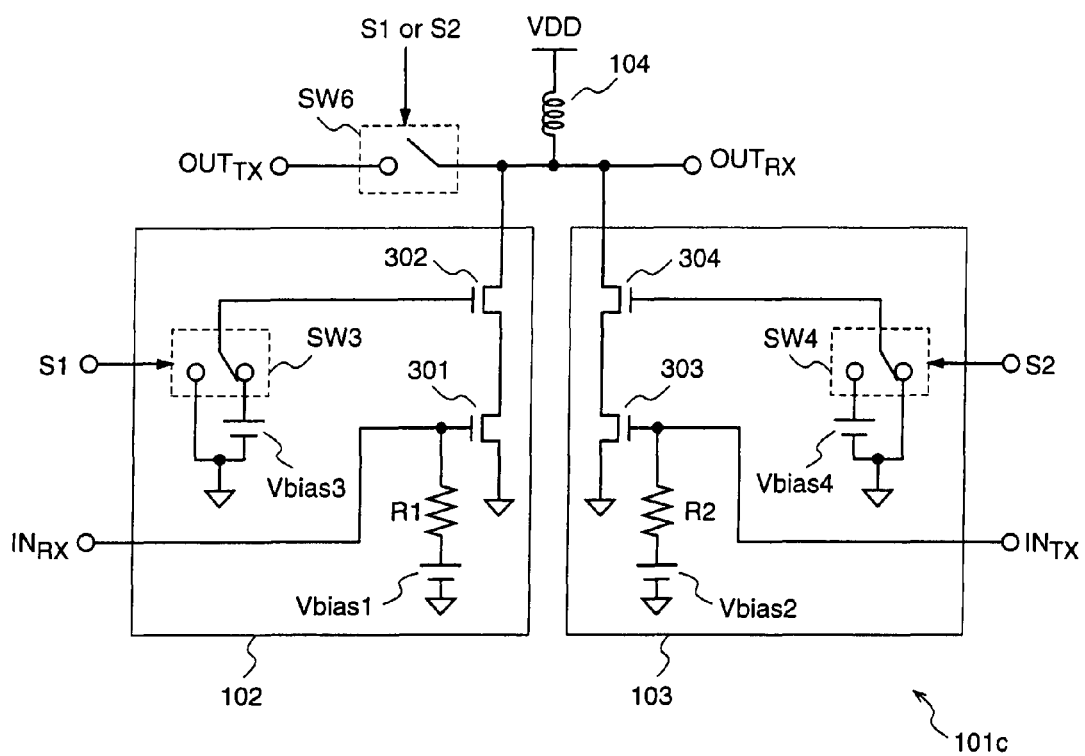
FIG. 4 is a diagram illustrating the construction of a high-frequency amplifier 101c as a third example of the first embodiment.

FIG. 4 shows the construction of a high-frequency amplifier 101*c* as a third example of the high-frequency amplifier 101 according to the first embodiment.

In FIG. 4, the high-frequency amplifier 101*c* is different from the high-frequency amplifier 101*b* shown in FIG. 3 in that it has output terminals for the transmission mode and the reception mode, respectively.

In the high-frequency amplifier 101*b* shown in FIG. 3, the signals outputted from the reception signal amplifying part 102 and the transmission signal amplifying part 103 use the common output terminal OUT. The amplified reception signal is connected to the circuits in the next stage, such as an amplifier, a mixer, and a filter, and input impedances of these circuits are usually high.

On the other hand, the amplified transmission signal is transmitted to an antenna, and the impedance of the antenna is usually as low as 50Ω. Further, even when an output matching circuit is connected between the high-frequency amplifier 101*b* and the antenna, the input impedance of the output matching circuit is low.

In the high-frequency amplifier 101*c* shown in FIG. 4, a transmission signal output terminal $OUT_{TX}$ for connecting the antenna or the output matching circuit with the high-frequency amplifier 101*b* is newly added, and a switch S6 is connected between the transmission signal output terminal $OUT_{TX}$ and the output terminal $OUT_{RX}$ (corresponding to OUT in FIG. 3).

During the reception mode, the switch SW6 is opened, and the amplifier reception signal is outputted from the output terminal $OUT_{RX}$.

During the transmission mode, the switch SW6 is short-circuited, and the amplified signal is outputted from the transmission signal output terminal $OUT_{TX}$.

Thereby, the reception signal that is amplified during the reception mode is prevented from leaking into the antenna.

As described above, according to the first embodiment, two spiral inductors to be connected as loads between the power supply terminal and the output terminal of the low-noise amplifier that amplifies a reception signal when performing communication by the time-division duplex scheme and between the power supply terminal and the output terminal of the power amplifier that amplifies the transmission signal, are unified. Therefore, when the high-frequency amplifier is constituted as an integrated circuit, the ratio of the spiral inductor to the substrate area of the integrated circuit can be reduced, and thereby the integrated circuit can be miniaturized, resulting in a high-frequency amplifier that can be manufactured at reduced cost.

While in this first embodiment the high-frequency amplifier 101 is provided with two transmission/reception switching control terminals, the number of the transmission/reception switching control terminals may be one or more so long as it can perform operational switching between the reception signal amplifying part 102 and the transmission signal amplifying part 103.

Further, while the switch SW6 has one transmission/reception switching control terminal (S1 or S2), the switch SW6 may have two transmission/reception switching control terminals (S1 and S2).

Further, in this first embodiment, inductors may be used in place of the resistors R1 and R2.

Further, while in this first embodiment the high-frequency amplifier 101 amplifies a single-phase transmission signal and a single-phase reception signal, two pieces of high-frequency amplifiers 101 may be provided to amplify a differential transmission signal and a differential reception signal.

Further, in the reception signal amplifying part, in order to achieve matching of either or both of noise and gain, an inductor, or a resistor, or a capacitor may be connected to either or both of the gate and source of the NMOS transistor.

Further, while in this first embodiment the reception signal amplifying part 102 and the transmission signal amplifying part 103 include only the NMOS transistors, the reception signal amplifying part 102 and the transmission signal amplifying part 103 may be constituted as high-frequency amplifiers including only PMOS transistors by inverting the polarity of the circuit so that those skilled in the art can easily understand.

Further, while in this first embodiment MOSFETs are used as the transistors, the transistors may be implemented by any of MESFETs, JFETs, HEMTs, bipolar junction transistors, and heterojunction transistors, or a combination of some of these transistors.

Further, the transistors in the first embodiment may be implemented by any of silicon, silicon-germanium, and III-V compound semiconductor.

Furthermore, the spiral inductor 104 according to the first embodiment includes inductors in the integrated circuit and in a package or module including the integrated circuit. The point is that the high-frequency amplifier 101 should be constituted such that the reception signal amplifying part 102 and the transmission signal amplifying part 103 share one inductor as a common load, and a switch for alternately turning on and off the reception signal amplifying part 102 and the transmission signal amplifying part 103 is provided.

Embodiment 2

Figure 5:
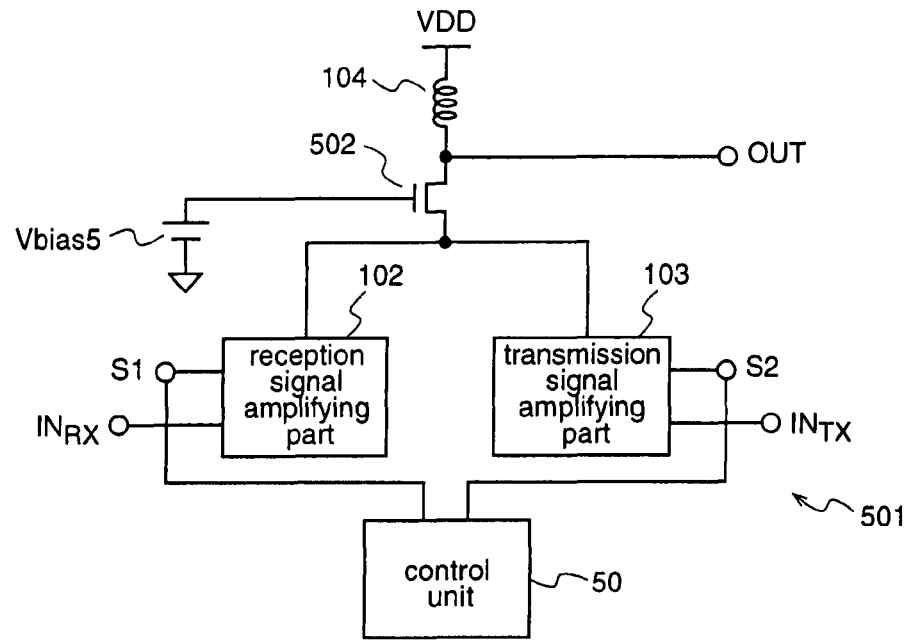
FIG. 5 is a diagram illustrating the construction of a high-frequency amplifier 501 according to a second embodiment of the present invention.

FIG. 5 shows the construction of a high-frequency amplifier 501 according to a second embodiment of the present invention.

With reference to FIG. 5, the high-frequency amplifier 501 includes a transmission signal amplifying part 102, a transmission signal amplifying part 103, a spiral inductor 104, an output terminal OUT, a transistor 502, and a DC power supply Vbias5. The reception signal amplifying part 102 includes a transmission/reception switching control terminal S1, and a reception signal input terminal $IN_{RX}$. The transmission signal amplifying part 103 includes a transmission/reception switching control terminal S2, and a transmission signal input terminal $IN_{TX}$.

A drain of the transistor 502 is connected to the output terminal OUT, and to the DC power supply VDD via the spiral inductor 104. A source of the transistor 502 is connected to the outputs of the reception signal amplifying part 102 and the transmission signal amplifying part 103. A gate of the transistor 502 is connected to a positive side power supply terminal of the DC power supply Vbias5.

The negative side power supply terminal of the DC power supply Vbias5 is connected to the ground.

In the respective modes of reception and transmission, the operations of the reception signal amplifying part 102 and the transmission signal amplifying part 103 are identical to the operations of those in the high-frequency amplifier 101 shown in FIG. 1 according to the first embodiment. The high-frequency amplifier 501 is different from the high-frequency amplifier 101 in that the transistor 502 is connected to the outputs of the reception signal amplifier 102 and the transmission signal amplifier 103.

A resonance frequency of the load of the high-frequency amplifier 501 is determined according to a capacitance $C_{POUT}$ at the output terminal OUT, and an inductance L of the spiral inductor 104. The capacitance $C_{POUT}$ at the output terminal OUT is expressed by a sum of a parasitic capacitance $C_{PCAS}$ of the drain of the transistor 502, an external load capacitance $C_{PL}$ of the high-frequency amplifier 101 connected to the output terminal OUT, and a parasitic capacitance $C_{PIND}$ of the spiral inductor 104. That is, $CP_{OUT}=C_{PCAS}+C_{PL}+C_{PIND}$ Accordingly, the resonance frequency $f_0$ of the load of the high-frequency amplifier 501 is expressed by $f_0=1/(2\pi(LC_{POUT})^{0.5})$ The transistor 502 functions as a cascade stage transistor. Accordingly, when the parasitic capacitances in the outputs of the receiving signal amplifying part 102 and transmission signal amplifying part 103 in the high-frequency amplifier 101 of the first embodiment are equal to those in the high-frequency amplifier 501 of the second embodiment, the parasitic capacitance in the output terminal OUT of the high-frequency amplifier 501 is smaller than that of the high-frequency amplifier 101.

When the high-frequency amplifier 501 and the high-frequency amplifier 101 of the first embodiment are operated with the same resonance frequency, the inductance L of the spiral inductor 104 can be increased. Further, a loss due to leakage through the parasitic capacitance at the output terminal OUT can be reduced. Accordingly, the gain of the high-frequency amplifier can be increased.

Figure 6:
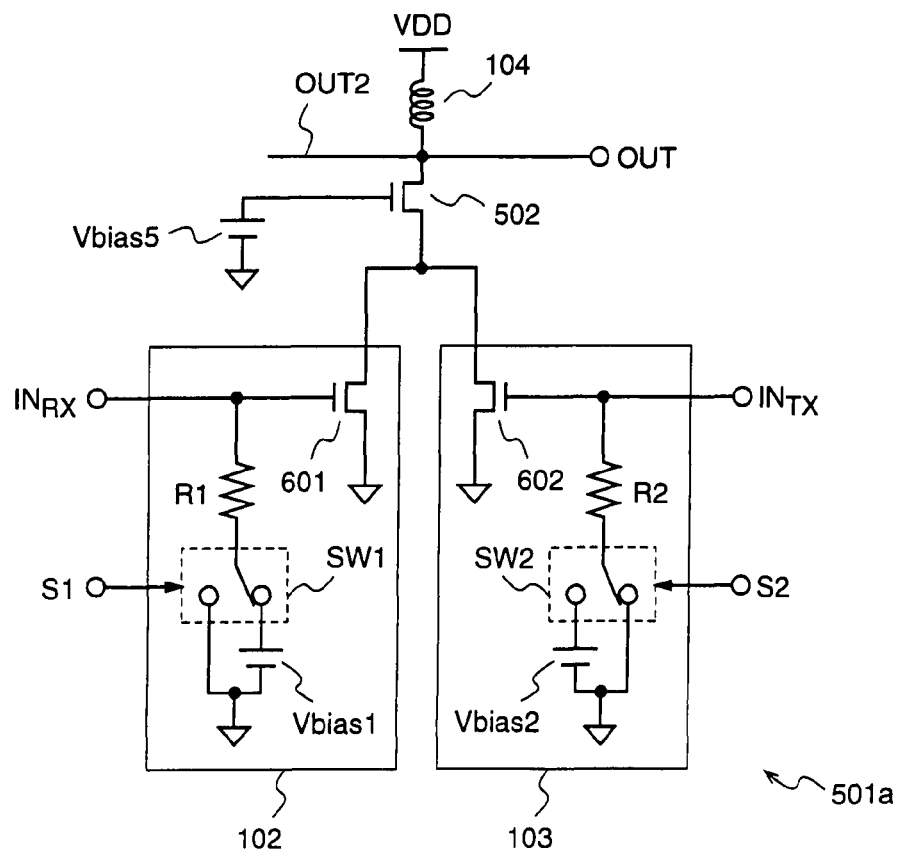
FIG. 6 is a diagram illustrating the construction of a high-frequency amplifier 501a as a first example of the second embodiment.

FIG. 6 shows the construction of a high-frequency amplifier 501a as a first example of the high-frequency amplifier 501 according to the second embodiment of the present invention.

With reference to FIG. 6, in the high-frequency amplifier 501a, the constructions of the reception signal amplifying part 102 and the transmission signal amplifying part 103 of the high-frequency amplifier 501 shown in FIG. 5 are implemented by NMOS transistors 601 and 602, resistors R1 and R2, switches SW1 and SW2, and DC power supplies Vbias1 and Vbias2, respectively.

A drain of the transistor 601 is connected to a source of the transistor 502 and to a drain of the transistor 602. Sources of the transistors 601 and 602 are connected to the ground. A gate of the transistor 601 is connected to the reception signal input terminal $IN_{RX}$ of the high-frequency amplifier 501a. The gate of the transistor 601 is also connected to a common terminal of the transmission/reception selector switch SW1 through the resistor R1. One of two terminals of the switch SW1 is connected to the ground, while the other terminal is connected to the positive side power supply terminal of the DC power supply Vbias1.

A gate of the transistor 602 is connected to the transmission signal input terminal $IN_{TX}$ of the high-frequency amplifier 501a. The gate of the transistor 602 is also connected to a common terminal of the transmission/reception selector switch SW2 through the resistor R2. One of two terminals of the switch SW2 is connected to the ground, while the other terminal is connected to the positive side power supply terminal of the DC power supply Vbias2.

The negative side power supply terminals of the DC power supplies Vbias1 and Vbias2 are connected to the ground. Further, an output node OUT2 outputs a signal toward the inside of the semiconductor integrated circuit, separated from the original output terminal OUT.

During the reception mode, transmission/reception switching control signals from the control unit 50 shown in FIG. 5 are input to the transmission/reception switching control terminal S1 and to the transmission/reception switching control terminal S2, and the switch SW1 is connected to the terminal on the bias DC power supply Vbias1 side, and thereby the transistor 601 turns on, while the switch SW2 is connected to the terminal on the ground side, and thereby the transistor 602 turns off.

In the transmission mode, the states of the switches SW1 and SW2 and the states of the transistors 601 and 602 are inverted from those in the reception mode. The transmission/reception selector switches SW1 and SW2 may have other constructions than those mentioned above so long as they can turn on/off the transistors 601 and 602, respectively.

Figure 7:
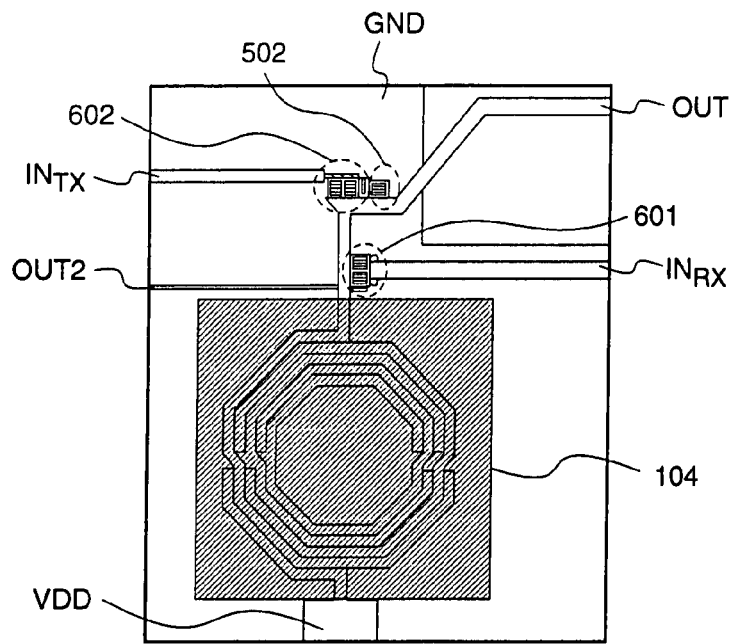
FIG. 7 is a layout diagram illustrating the outline of the high-frequency amplifier 501a as the first example of the second embodiment.

FIG. 7 is a diagram illustrating a rough layout of the high-frequency amplifier 501a shown in FIG. 6 which is fabricated in an ordinary CMOS process. In FIG. 7, GND indicates the source of the transistor 602. The same reference numerals as those shown in FIG. 6 denote the same or corresponding elements.

Figure 12A:
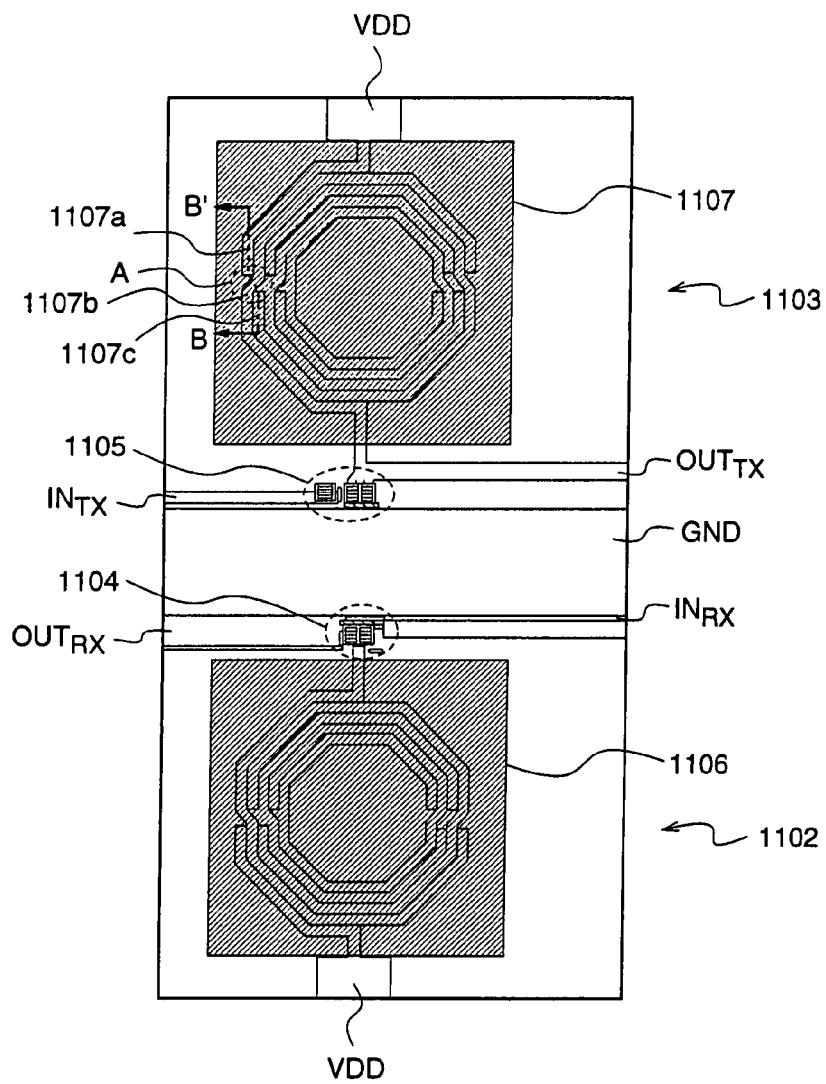
FIG. 12(a) is a plan view of a layout illustrating the outline of the conventional high-frequency amplifier 1101.
Figure 12B:
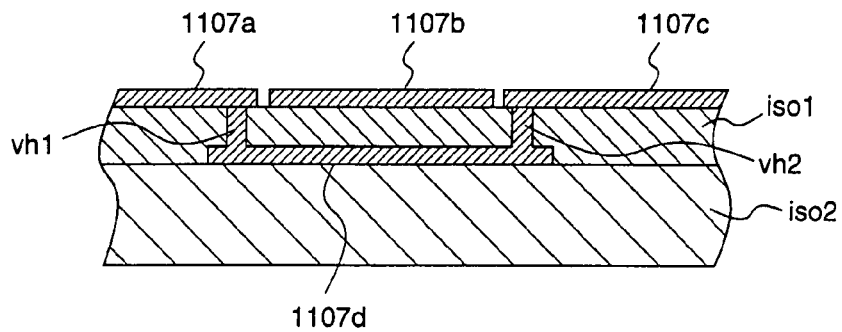
FIG. 12(b) is a cross-sectional view taken along a line B-B' in the layout illustrating the outline of the conventional high-frequency amplifier 1101.

In the layout shown in FIG. 7, the area occupied by the spiral inductor having an inductance of 6 nH is 0.16 mm$^2$, and the area of the layout of the high-frequency amplifier is 0.35 mm$^2$. Although the spiral inductor occupies 46% of the entire layout area, the area of the high-frequency amplifier 501a according to the second embodiment can reduce to 58% in comparison with the conventional example shown in FIG. 12. This area reduction effect can be achieved in all the high-frequency amplifiers according to the first and second embodiments of the invention.

Figure 8:
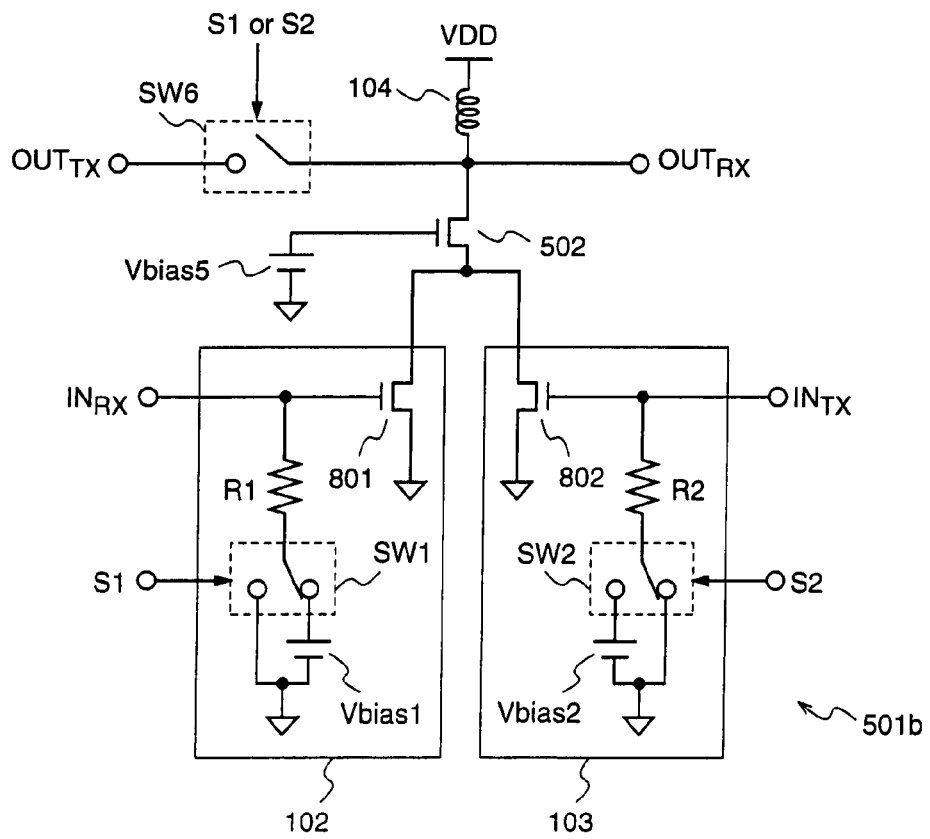
FIG. 8 is a diagram illustrating the construction of a high-frequency amplifier 501b as a second example of the second embodiment.

FIG. 8 shows the construction of a high-frequency amplifier 501b which is a second example of the high-frequency amplifier 501 according to the second embodiment.

In FIG. 8, the high-frequency amplifier 501b is obtained by newly adding a transmission signal output terminal $OUT_{TX}$ and a switch SW6 to the above-mentioned high-frequency amplifier 501a shown in FIG. 6. The switch SW6 is connected between the transmission signal output terminal $OUT_{TX}$ and the output terminal $OUT_{RX}$ (corresponding to the OUT2 in FIG. 6).

During the reception mode, the switch SW6 is opened, and the amplified reception signal is outputted from the output terminal $OUT_{RX}$. During the transmission mode, the switch SW6 is short-circuited, and the amplified transmission signal is outputted from the transmission signal output terminal $OUT_{TX}$.

As described above, according to the second embodiment, two spiral inductors to be connected as loads between the power supply terminal and the output terminal of the low-noise amplifier that amplifies a reception signal when performing communication by the time-division duplex scheme and between the power supply terminal and the output terminal of the power amplifier that amplifies the transmission signal, are unified, and the cascade stage transistor is provided. Therefore, when the high-frequency amplifier is constituted as an integrated circuit, the ratio of the spiral inductor to the substrate area of the integrated circuit can be reduced, and thereby the integrated circuit can be miniaturized, resulting in a high-frequency amplifier that can be manufactured at reduced cost and has less parasitic capacitance at the output terminal.

While in this second embodiment the high-frequency amplifier 501 includes two transmission/reception switching control terminals, the high-frequency amplifier may include at least one transmission/reception switching control terminal so long as it can perform operational switching between the reception signal amplifying part 102 and the transmission signal amplifying part 103.

Further, while the switch SW6 has one transmission/reception switching control terminal (S1 or S2), the switch SW6 may have two transmission/reception switching control terminals (S1 and S2).

Further, in this second embodiment, inductors may be used in place of the resistors R1 and R2.

Further, while in this second embodiment the high-frequency amplifier 501 amplifies a single-phase transmission signal and a single-phase reception signal, two pieces of high-frequency amplifiers 501 may be provided to amplify a differential transmission signal and a differential reception signal.

Further, in the reception signal amplifying part, in order to achieve matching of either or both of noise and gain, an inductor, or a resistor, or a capacitor may be connected to either or both of the gate and source of the NMOS transistor.

Further, while in this second embodiment the reception signal amplifying part 102 and the transmission signal amplifying part 103 include only the NMOS transistors, the polarity of the circuit may be inverted. That is, the reception signal amplifying part 102 and the transmission signal amplifying part 103 may be constituted as high-frequency amplifiers including only PMOS transistors.

Further, the transistors described in this second embodiment may be implemented by any of MOSFETs, MESFETs, JFETs, HEMTs, bipolar junction transistors, and heterojunction transistors, or a combination of some of these transistors.

Further, the transistors described in this second embodiment may be implemented by any of silicon, silicon-germanium, and III-V compound semiconductor.

Furthermore, the spiral inductor 104 according to the second embodiment includes inductors in the integrated circuit and in a package or module including the integrated circuit. The point is that the high-frequency amplifier 501 should be constituted such that the reception signal amplifying part 102 and the transmission signal amplifying part 103 share one inductor as a common load, a switch for alternately selecting on and off of the reception signal amplifying part 102 and the transmission signal amplifying part 103 is provided, and cascade transistors are connected between the inductor and the outputs of the reception signal amplifying part 102 and the transmission signal amplifying part 103, respectively.

Embodiment 3

Figure 9:
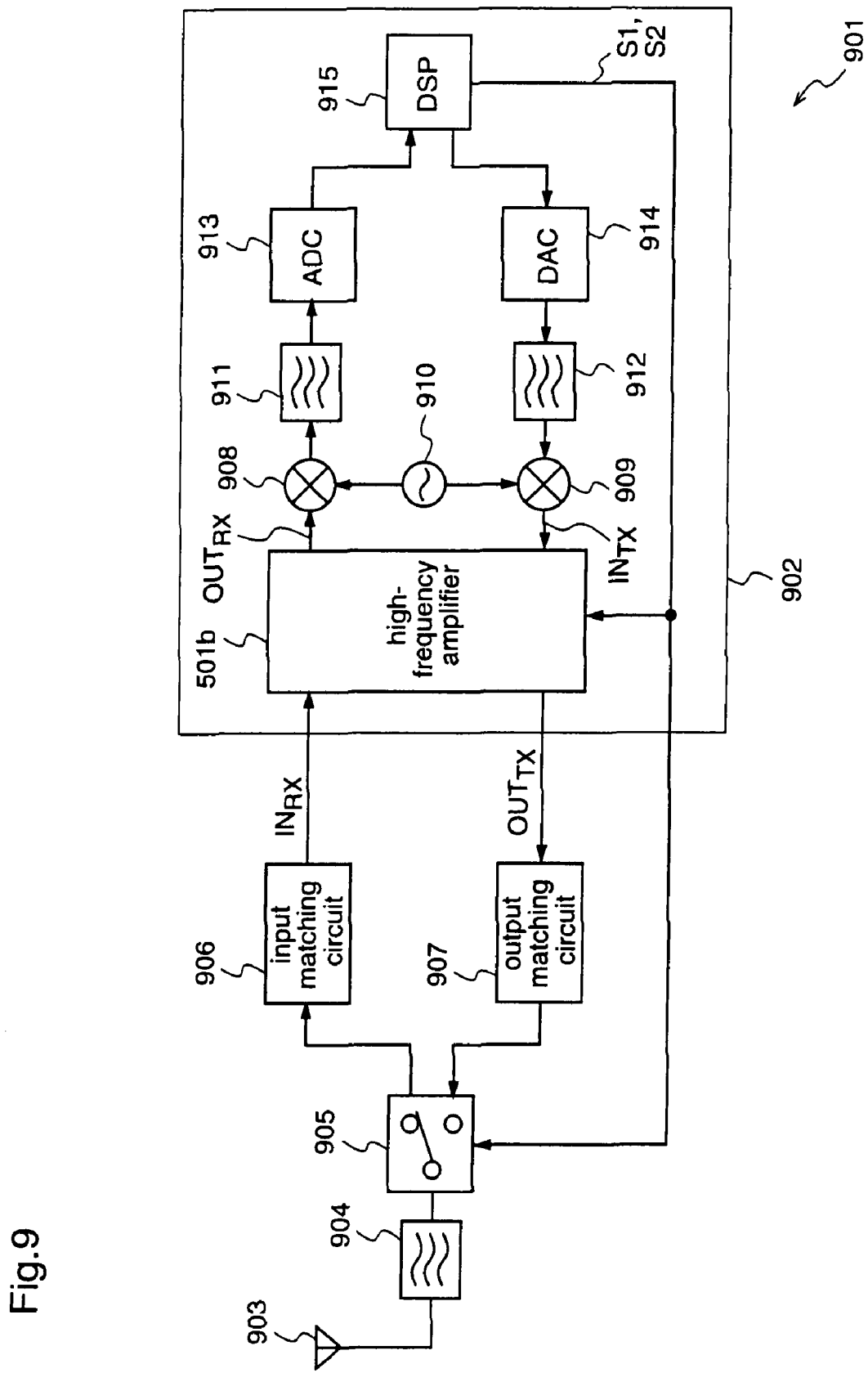
FIG. 9 is a diagram illustrating the construction of a transmission/reception system 901 according to a third embodiment of the present invention.

FIG. 9 shows the construction of a transmission/reception system 901 according to a third embodiment of the present invention.

The transmission/reception system 901 shown in FIG. 9 includes a high-frequency amplifier 501b which is identical to that of the second embodiment.

In FIG. 9, the transmission/reception system 901 comprises a transmission/reception integrated circuit for communication 902, an antenna 903, an RF filter 904, a transmission/reception selector switch 905, an input matching circuit 906, and an output matching circuit 907.

The communication transmission/reception integrated circuit 902 comprises a high-frequency amplifier 501b which is identical to that of the second embodiment, a reception mixer 908, a transmission mixer 909, a frequency synthesizer 910, a reception filter 911, a transmission filter 912, an A/D converter (hereinafter referred to as "ADC") 913, a D/A converter (hereinafter referred to as "DAC") 914, and a digital signal processor (hereinafter referred to as "DSP") 915.

Next, the operation will be described.

In the time division duplex scheme, in response to a timing of switching between signal transmission and reception, the transmission/reception selector switch 905 and the high-frequency amplifier 501b are controlled by a transmission/reception switching signal from the DSP 915. The transmission/reception switching signal may be generated by a control circuit other than the DSP, as shown in FIG. 1.

During the reception, a signal received by the antenna 903 is input to the high-frequency amplifier 501b through the RF filter 904, the transmission/reception selector switch 905, and the input matching circuit 906. The reception signal amplified by the high-frequency amplifier 501b is input to the reception mixer 908.

The reception mixer 908 mixes the reception signal outputted from the high-frequency amplifier 501b and an oscillation signal outputted from the frequency synthesizer 910. The output of the reception mixer 908 is supplied to the ADC 913 through the reception filter 911. The ADC 913 converts the analog reception signal outputted from the reception filter 911 into a digital reception signal. The DSP 915 processes the digital reception signal.

Next, during the transmission, the digital transmission signal processed by the DSP 915 is converted into an analog transmission signal by the DAC 914. The analog transmission signal is input to the transmission mixer 909 through the transmission filter 912. The transmission mixer 909 mixes the transmission signal outputted from the transmission mixer 909 and the oscillation signal outputted from the frequency synthesizer 910.

The high-frequency amplifier 501b amplifies the output of the transmission mixer 909. The amplified transmission signal is transmitted through the output matching circuit 907, the transmission/reception selector switch 905, and the RF filter 904, and outputted from the antenna 903.

As described above, since the high-frequency amplifier 501b identical to that of the second embodiment is used as a transmission/reception signal amplifier, the areas of the high-frequency amplifier 501b and the transmission/reception integrated circuit for communication 902 are reduced and thereby the cost is reduced, resulting in the transmission/reception system 901 with reduced production cost. A high-frequency amplifier 101c identical to that of the first embodiment may be used instead of the high-frequency amplifier 501b.

Figure 10:
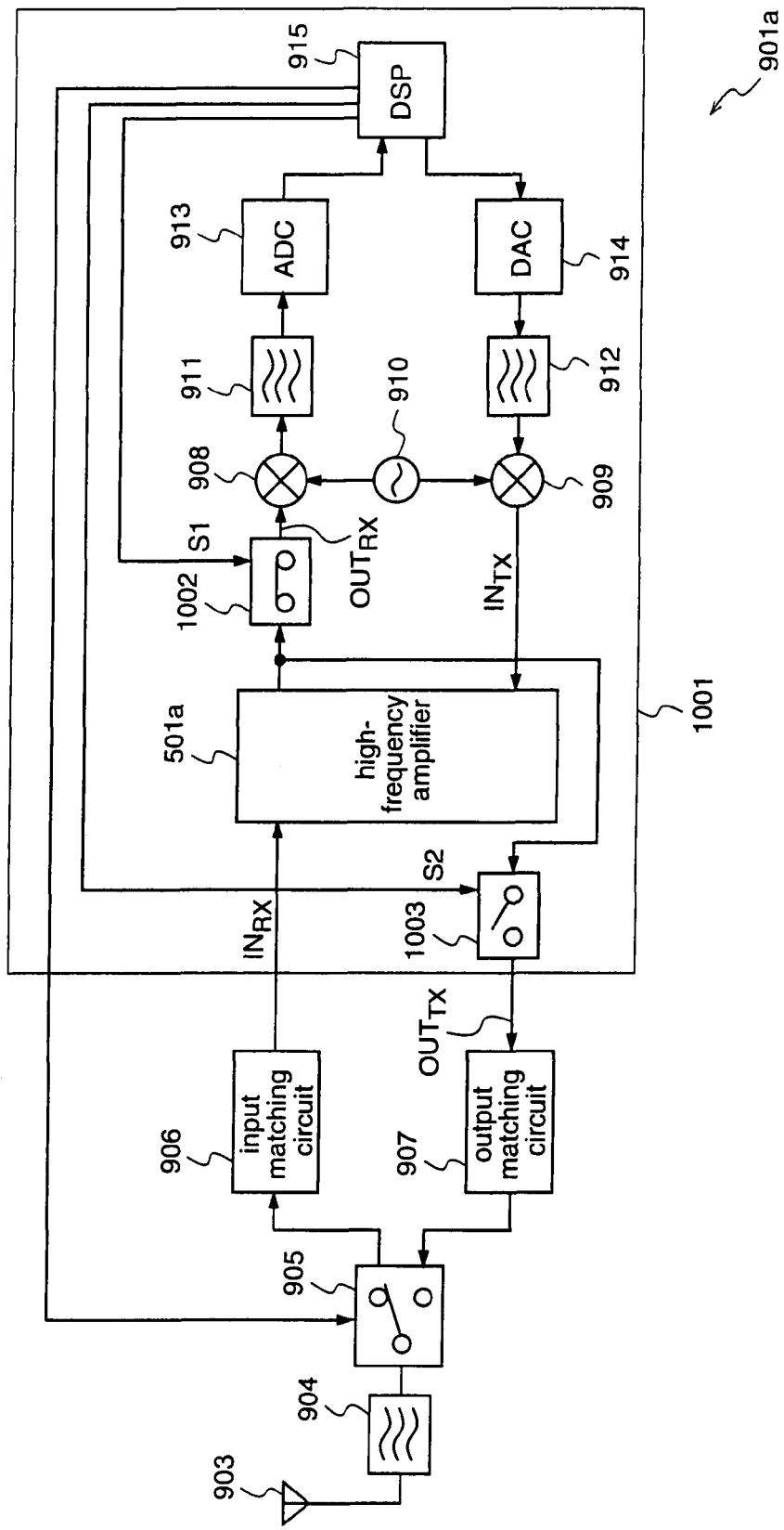
FIG. 10 is a diagram illustrating the construction of a transmission/reception system 901a as a second example of the third embodiment.

FIG. 10 shows the construction of a transmission/reception system 901a as a second example of the transmission/reception system 901 according to the third embodiment.

The transmission/reception system 901a shown in FIG. 10 includes a high-frequency amplifier 501a which is identical to that of the second embodiment.

The transmission/reception system 901a shown in FIG. 10 and the transmission/reception system 901 shown in FIG. 9 are different from each other in the constructions of the transmission/reception integrated circuit for communication 902 and the transmission/reception integrated circuit for communication 1001.

The transmission/reception integrated circuit for communication 1001 comprises transmission/reception selector switches 1002 and 1003, a high-frequency amplifier 501a according to the second embodiment, a reception mixer 908, a transmission mixer 909, a frequency synthesizer 910, a reception filter 911, a transmission filter 912, an ADC 913, a DAC 914, and a DSP 915.

The transmission/reception selector switch 1002 is turned on in the reception mode, and turned off in the transmission mode. The transmission/reception selector switch 1003 performs an operation reverse to the transmission/reception selector switch 1002. Other operations are identical to those mentioned with reference to FIG. 9.

As described above, according to the third embodiment, the transmission/reception system is constituted by using the high-frequency amplifier in which two spiral inductors to be connected as loads between the power supply terminal and the output terminal of the low-noise amplifier that amplifies a reception signal when performing communication by the time-division duplex scheme and between the power supply terminal and the output terminal of the power amplifier that amplifies the transmission signal, are unified, and the cascade stage transistor is provided. Therefore, when the transmission/reception system is constituted as an integrated circuit, the ratio of the spiral inductor to the substrate area of the integrated circuit can be reduced, and thereby the integrated circuit can be miniaturized, resulting in a transmission/reception system which can be manufactured at reduced cost, and has less parasitic capacitance at the output terminal of the high-frequency amplifier.

The high-frequency amplifiers 101a and 101b may be used instead of the high-frequency amplifiers 501a and 501b, respectively. The point is that a transmission/reception system to be used for time-division duplex communication should be constituted by using the high-frequency amplifier described for the first embodiment or the second embodiment.

Embodiment 4

By the way, in recent years, a high-speed transmission technique for radio communication, which is called MIMO (Multiple Input Multiple Output), has been developed, and it has already been put to practical use in some fields such as radio LAN equipment. The MIMO is a technique for performing transmission/reception of data by using plural antennas in both of a transmitter and a receiver.

In the MIMO, data to be transmitted is divided into plural data to transmit the data in parallel, i.e., simultaneously, in space by using plural antennas for one frequency band, and the data received by plural antennas are synthesized and decoded, whereby the communication speed is significantly increased, and the communication status is significantly improved under an environment where many obstacles exist, such as indoor.

That is, at the transmitter side of the MIMO, a transmission signal is subjected to space-time coding (STC) to perform recombination of data in both regions of time and space, and thereafter, radio waves are outputted from the plural antennas.

At the receiver side of the MIMO, the radio waves that have propagated through a multipath transmission line are received by plural antennas, and space-time decoding (STD) which is a process reverse to the STC is performed, whereby interferences are removed from the plural signals, and the respective signals are separated and synthesized to output a reception signal.

Figure 13A:
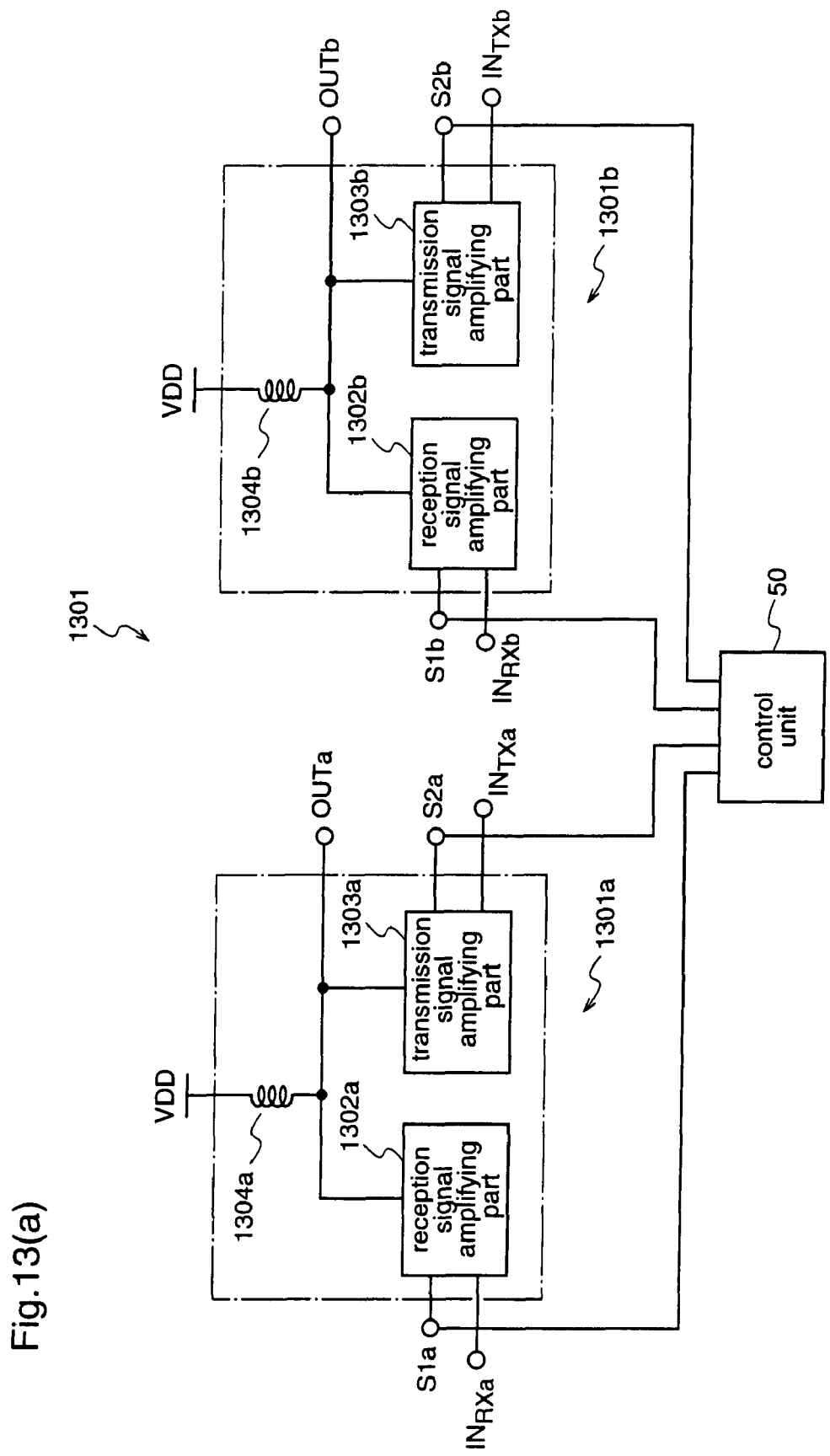
FIG. 13(a) is a diagram illustrating the construction of a high-frequency amplifier 1301 according to a fourth embodiment of the present invention.
Figure 13B:
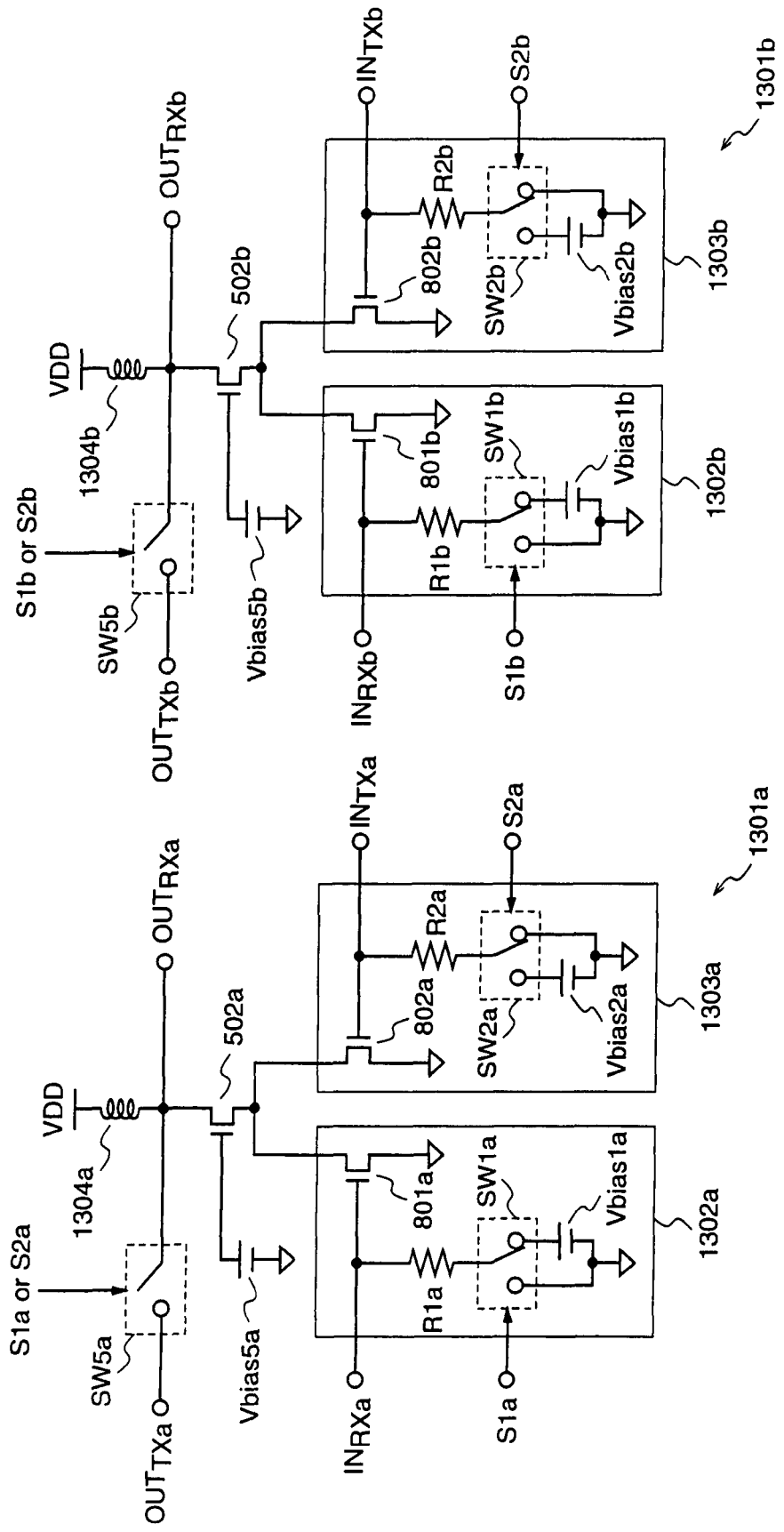
FIG. 13(b) is a diagram illustrating the specific construction of the high-frequency amplifier 1301 according to the fourth embodiment.

FIG. 13 shows the construction of a high-frequency amplifier 1301 according to the fourth embodiment.

The high-frequency amplifier 1301 shown in FIG. 13(*a*) comprises two high-frequency amplifiers 1301a and 1301b each having a reception signal amplifying part and a transmission signal amplifying part which are constituted as mentioned for the first embodiment.

In FIG. 13(*a*), the high-frequency amplifiers 1301a, 1301b have reception signal amplifying parts 1302a, 1302b, transmission signal amplifying parts 1303a, 1303b, spiral inductors 1304a, 1304b, and output terminals OUTa, OUTb, respectively.

The reception signal amplifying parts 1302a, 1302b have transmission/reception switching control terminals S1a, S1b, and reception signal input terminals $IN_{RX}a$, $IN_{RX}b$, respectively. The transmission signal amplifying parts 1303a, 1303b have transmission/reception switching control terminals S2a, S2b, and transmission signal input terminals $IN_{TX}a$, $IN_{TX}b$, respectively.

The reception signal amplifying parts 1302a, 1302b and the transmission signal amplifying parts 1303a, 1303b are connected to DC power supplies VDDa, VDDb through the spiral inductors 1304a, 1304b, respectively.

FIG. 13(*b*) shows the specific construction of FIG. 13(*a*). The high-frequency amplifiers 1301a and 1301b have the same construction as that of the high-frequency amplifier 501b shown in FIG. 8. In FIG. 13(*b*), suffixes a, b are added to the constituents of the respective high-frequency amplifiers.

In the high-frequency amplifier 1301 thus constructed, by operating both of the high-frequency amplifiers 1301a and 1301b as transmission signal amplifiers or reception signal amplifiers, the high frequency amplifier can be operated as a transmission signal amplifier or a reception signal amplifier of the MIMO system.

Further, when one of the high-frequency amplifiers 1301a and 1301b is operated as a transmission signal amplifier while the other is operated as a reception signal amplifier, the high-frequency amplifier can be operated as a transmission/reception high-frequency amplifier of a FDD (Frequency Division Duplex) system.

An FDD system transceiver divides a frequency band to be used into a frequency band for transmission and a frequency band for reception to realize simultaneous execution of transmission and reception. Handy phones excluding PHS (Personal Handyphone System) adopt the FDD system.

FIG. 14 shows a transmission/reception system according to the fourth embodiment. FIGS. 14(*a*) and 14(*b*) show the cases where the high-frequency amplifier according to the fourth embodiment is operated as a MIMO transceiver 1401a and an FDD transceiver 1401b, respectively.

The MIMO transceiver shown in FIG. 14(*a*) has two transmission/reception systems 901a and 901b which are constituted as shown in FIG. 9. In FIG. 14(*a*), suffixes a, b are added to the constituents of the respective transmission/reception systems.

In the MIMO transceiver, transmission/reception selector switches 905a and 905b are controlled so that both of the two transmission/reception system 901a and 901b perform reception or transmission. The two transmission/reception integrated circuits for communication 902a and 902b share a DSP. The shared DSP 915d performs STD to the reception digital signals obtained from ADCs 913a and 913b in the two transmission/reception integrated circuits for communication 902a and 902b, and performs STC to the transmission digital signals to be input to the DACs 914a and 914b, respectively.

The two transmission/reception integrated circuits for communication 902a and 902b are contained in a package 901d. Further, the two transmission/reception systems 901a and 901b may be constituted as an integrated circuit.

Figure 14A:
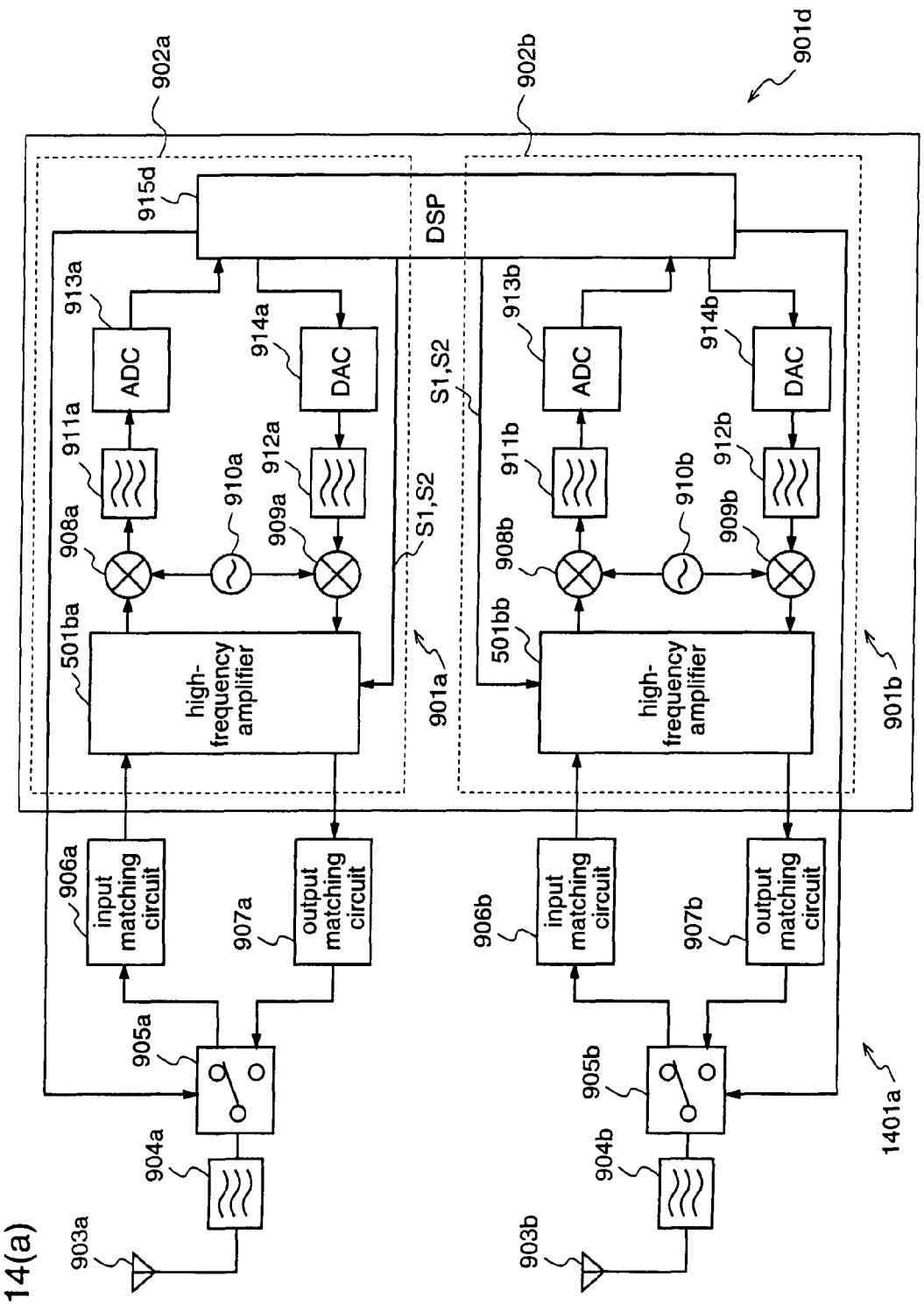
FIG. 14(a) is a diagram illustrating the case where the high-frequency amplifier according to the fourth embodiment is operated as a MIMO transceiver.
Figure 14B:
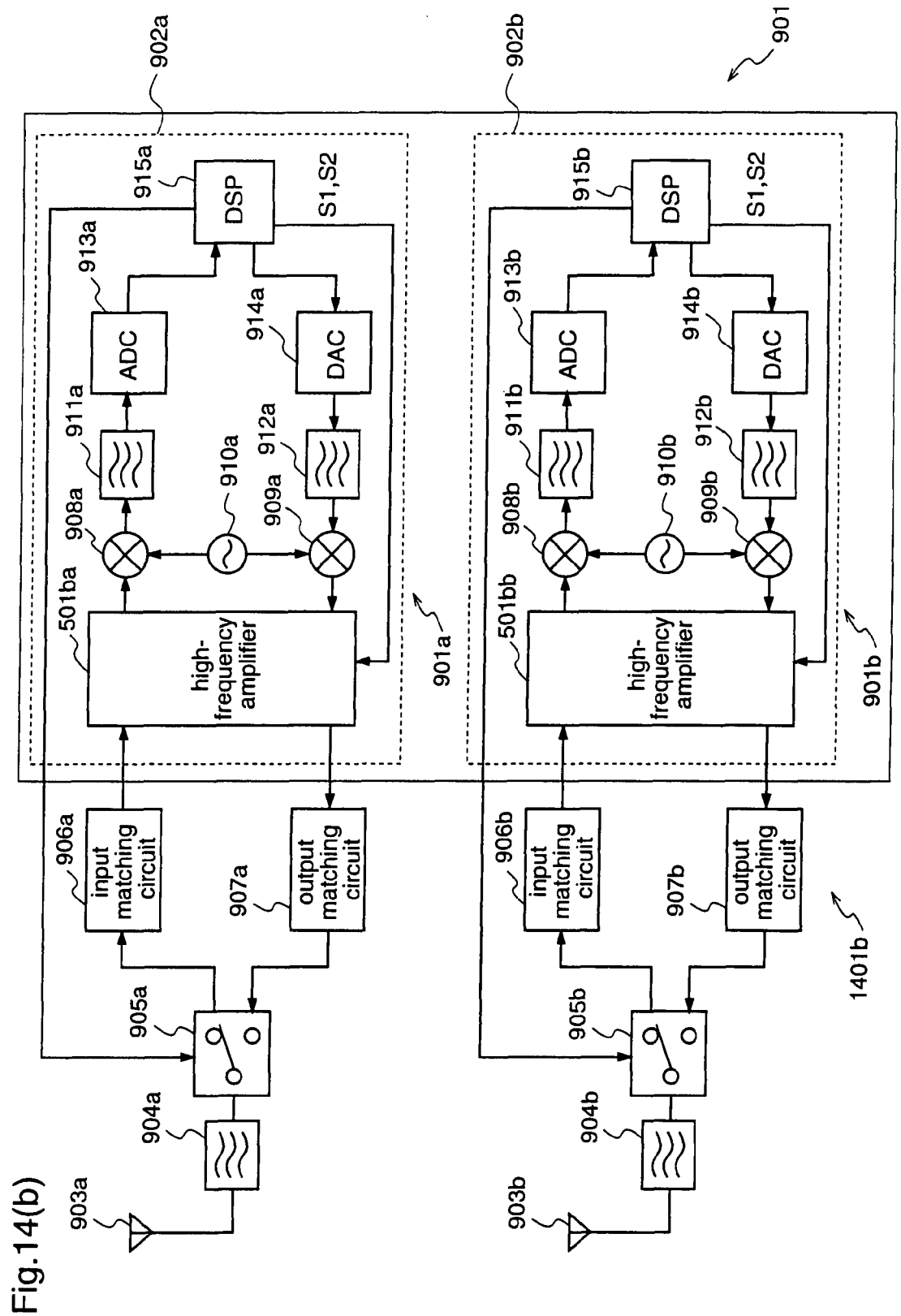
FIG. 14(b) is a diagram illustrating the case where the high-frequency amplifier according to the fourth embodiment is operated as an FDD transceiver.

The FDD transceiver shown in FIG. 14(b) has two transmission/reception systems 901a and 901b which are constituted as shown in FIG. 9. In FIG. 14(a), suffixes a, b are added to the constituents of the respective transmission/reception systems.

In the FDD transceiver, transmission/reception selector switches 905a and 905b are controlled so that one of the two transmission/reception systems 901a and 901b performs reception while the other performs transmission.

As described above, according to the fourth embodiment, two high-frequency amplifiers having the same construction as that of the first embodiment are provided in a single transmission/reception apparatus, and both of the two high-frequency amplifiers are operated as transmitters or receivers, or one of the two high-frequency amplifiers is operated as a transmitter while the other is operated as a receiver, whereby the single transmission/reception apparatus can be operated as either a MIMO system transceiver or an FDD system transceiver.

To be specific, two high-frequency amplifiers are provided in one transmission/reception apparatus, each amplifier having such a construction that two spiral inductors to be connected as loads between the power supply terminal and the output terminal of the low-noise amplifier that amplifies a reception signal when performing communication by the time-division duplex scheme and between the power supply terminal and the output terminal of the power amplifier that amplifies the transmission signal, are unified. When both of the two high-frequency amplifiers are operated as transmitters or receivers, these amplifiers can be operated in the MIMO system which enables an increase in the communication speed. On the other hand, when one of the two high-frequency amplifiers is operated as a transmitter while the other is operated as a receiver, these amplifiers can be operated in the FDD system which enables simultaneous execution of transmission and reception. While in this fourth embodiment two high-frequency amplifiers are provided, three or more high-frequency amplifiers may be provided.

Further, while in this fourth embodiment the construction of the high-frequency amplifier body is identical to that shown in FIG. 8, it may be identical to any of those shown in FIGS. 2, 3(a), 4, and 6.

Embodiment 5

A fifth embodiment of the present invention makes up for a deficiency in capacitance at an output terminal OUT of a high-frequency amplifier which is constituted similarly to that of the second embodiment shown in FIG. 8.

Figure 15A:
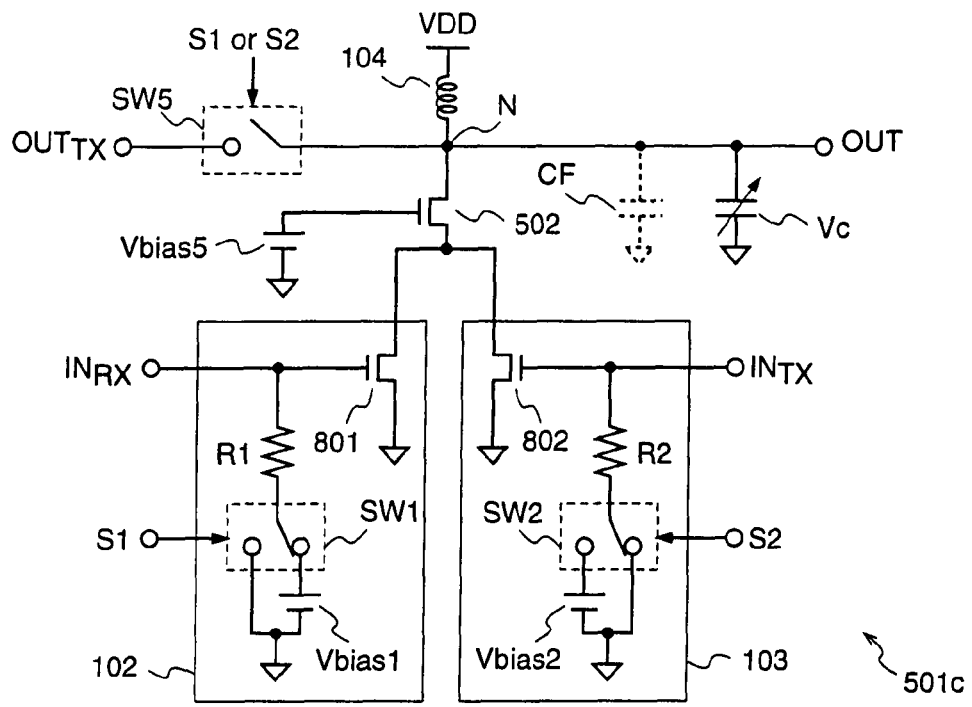
FIG. 15(a) is a diagram illustrating the construction of a high-frequency amplifier 501c as a first example of a fifth embodiment of the present invention.

FIG. 15(a) shows the construction of a high-frequency amplifier 501c which is a first example of a high-frequency amplifier 501 according to the fifth embodiment.

In FIG. 15(a), CF denotes a parasitic capacitance at the output terminal OUT, and Vc denotes a variable capacitance element placed between the output terminal OUT and the ground.

When this high-frequency amplifier 501c is used as a transceiver of radio LAN, it is necessary to set its resonance frequency to 2.4 GHz. Since a resonance frequency f0 can be obtained by $f0=1/(2\pi(LC)^{0.5})$, a capacitance C needed for obtaining a desired resonance frequency f0 can be obtained by $C=1/(L(2\pi f0)^2)$.

By the way, while a parasitic capacitance CF occurs between the ground and the node N at which the output terminal OUT, the spiral inductor 104, the transistor 502, and the switch SW5 are connected each other, the capacitance value of this parasitic capacitance is sometimes insufficient to obtain the above-mentioned resonance frequency of 2.4 GHz.

So, a variable capacitance element Vc is provided between the node N and the ground, and the capacitance value of the variable capacitance element is varied to make up for the deficiency in the parasitic capacitance, thereby obtaining the desired resonance frequency.

Figure 15B:
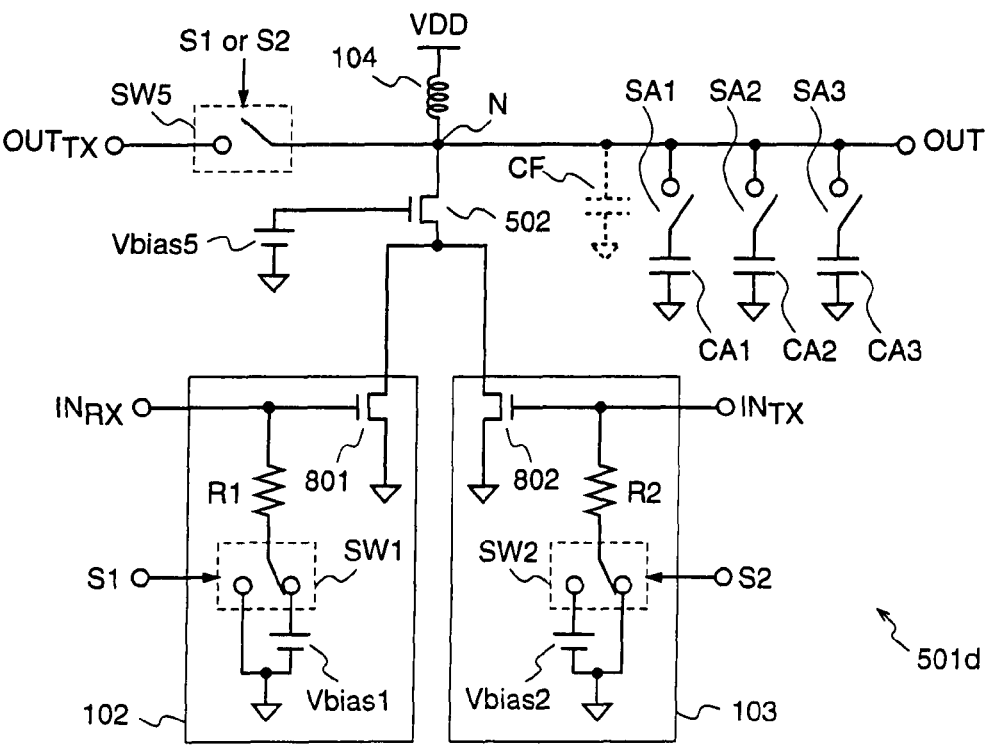
FIG. 15(b) is a diagram illustrating the construction of a high-frequency amplifier 501d as a second example of the fifth embodiment.

FIG. 15(b) shows the construction of a high-frequency amplifier 501d which is a second example of the high-frequency amplifier 501 according to the fifth embodiment of the present invention.

In this second example, series-connected bodies each comprising a fixed capacitance and a switch are connected between the node N and the ground, instead of the variable capacitance element according to the first example.

In FIG. 15(b), CA1 and SA1, CA2 and SA2, CA3 and SA3 are series-connected capacitances and switches, respectively, and the three series-connected bodies comprising these capacitances and switches are respectively connected between the node N and the ground.

For example, a relationship of CA1>CA2>CA3 is established among the values of the capacitances CA1, CA2, and CA3.

In this case, when the parasitic capacitance and the capacitance CA1 are not sufficient to obtain the above-mentioned resonance frequency, the switch SA2 is closed to add the capacitance CA2. If, even in this state, the capacitance value to obtain the desired resonance frequency is not achieved, the switch SA3 is closed to add the capacitance CA3.

In this way, the capacitance to be added to the parasitic capacitance value is varied in stages by appropriately selecting the switches SA1, SA2, and SA3, thereby obtaining the desired resonance frequency.

Figure 15C:
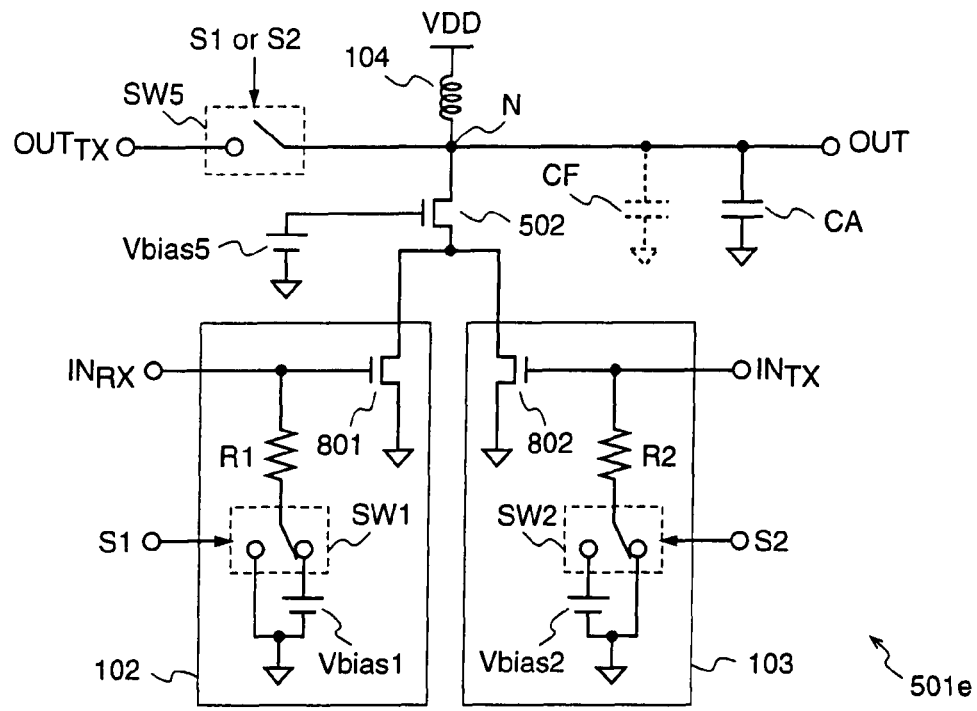
FIG. 15(c) is a diagram illustrating the construction of a high-frequency amplifier 501e as a third example of the fifth embodiment.

Further, FIG. 15(c) shows the construction of a high-frequency amplifier 501e as a third example of the high-frequency amplifier 501 according to the fifth embodiment.

In this third example, a capacitance CA having a predetermined capacitance value is connected between the node N and the ground.

If the value of the parasitic capacitance CF that occurs at the node N is known by such as measuring the value in advance, it is possible to calculate a capacitance value corresponding to a deficiency in the capacitance required to obtain the desired resonance frequency.

Accordingly, the deficient capacitance value is incorporated as the capacitance CA, thereby obtaining the high-frequency amplifier 501e that does not require adjustment of the capacitance value to be added, which amplifier is suitable for mass production.

As described above, according to the fifth embodiment, when a desired resonance frequency cannot be obtained by only the capacitance value of the parasitic capacitance that occurs at the node N, a capacitance element having a capacitance value corresponding to the deficiency is connected to the node N. Therefore, a deficiency in the capacitance required to obtain the desired resonance frequency is appropriated, thereby obtaining a high-frequency amplifier having the desired resonance frequency.

While in this fifth embodiment the construction of the high-frequency amplifier body is identical to that shown in FIG. 8, it may be identical to any of those shown in FIGS. 2, 3, 3(a), 4, and 6.

Embodiment 6

In a sixth embodiment of the present invention, a construction for adjusting a bias voltage is provided at the input side of a high-frequency amplifier that is identical to the second embodiment.

Figure 16A:
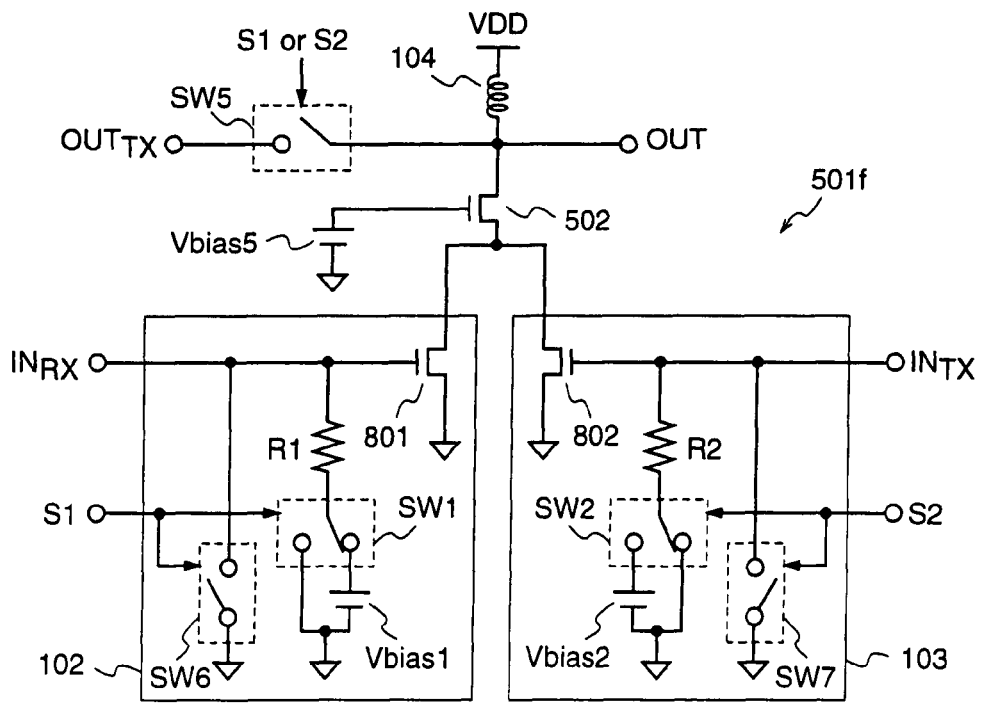
FIG. 16(a) is a diagram illustrating the construction of a high-frequency amplifier 501f as a first example of a sixth embodiment of the present invention.

FIG. 16(a) shows a first example of the high-frequency amplifier according to the sixth embodiment. With reference to FIG. 16(a), switches SW6 and SW7 are provided between the gates of transistors 801 and 802 and the ground, respectively, so that the switches SW6 and SW7 are turned on when the switches SW1 and SW2 are placed at the ground side, and turned off when the switches are placed at the bias power supply side.

Assuming that these switches SW6 and SW7 do not exist, when the switches SW1 and SW2 select the ground side, the gate voltages of the transistors 801 and 802 become higher than the ground voltage because the resistors R1 and R2 exist.

On the other hand, in the construction shown in FIG. 16(a) having the switches SW6 and SW7, since the switches SW6 and SW7 are turned on simultaneously with the switches SW1 and SW2, the gates of the transistors 801 and 802 of the high-frequency amplifier 501 can be reliably fixed to the ground voltage.

Figure 16B:
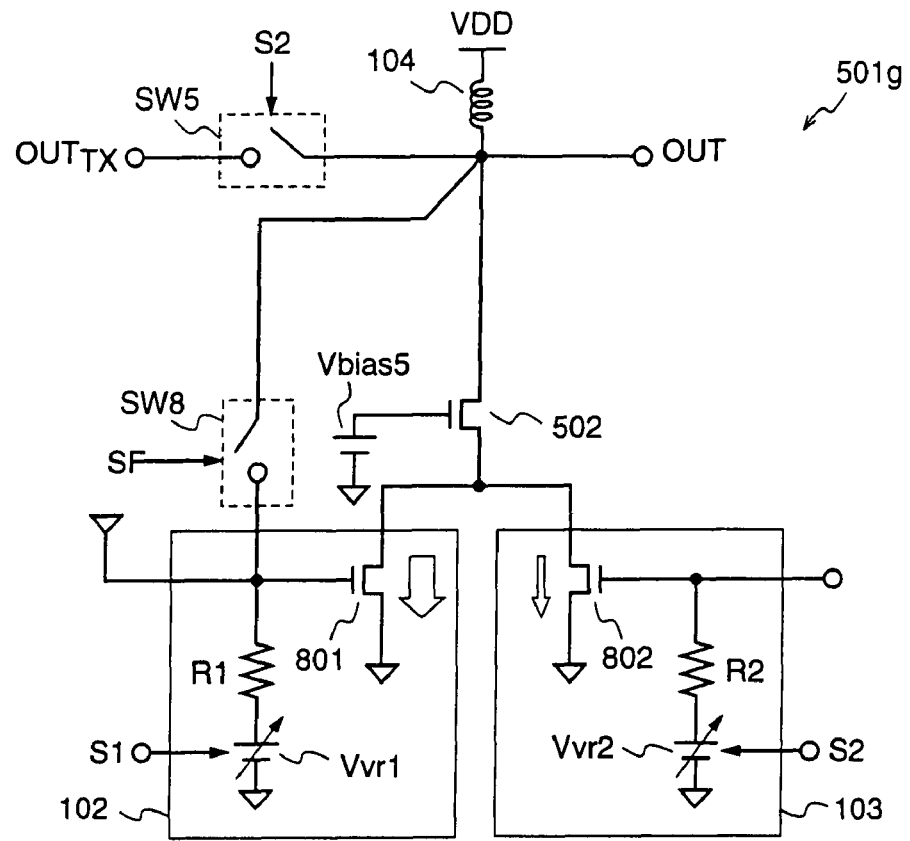
FIG. 16(b) is a diagram illustrating the construction of a high-frequency amplifier 501g as a second example of the sixth embodiment.

FIG. 16(b) shows a second embodiment example of the high-frequency amplifier according to the sixth embodiment. In FIG. 16(b), variable voltage supplies Vvr1 and Vvr2 that can vary voltage are disposed between the ground and the ground side terminals of the resistors R1 and R2, respectively, and a switch SW8 is disposed between the ground and the ground side terminals of the resistors R1 and R2.

A faint radio wave received by the antenna is input to the gate of the transistor 801, and when this radio wave is amplified by the high-frequency amplifier 501g, the current that flows in the transistor 801 is increased by increasing the voltage of the variable voltage supply Vvr2, and the current that flows in the transistor 802 is decreased by lowering the voltage of the variable voltage supply Vvr2, thereby setting the transmission signal amplifying part 103 in an operation state close to the halting state.

For example, the gate-to-source voltage of the transistor 802 is set to 0.4V~0.5V by adjusting the variable voltage supply Vvr2 so as to operate the transmission signal amplifying part 103 in the state where current hardly flows in the transistor 802, whereby the amplification can be carried out at lower noise relative to the case where only the reception signal amplifying part 102 is operated.

Further, as performances of a high-frequency amplifier, especially, a front end which is an amplifier directly connected to an antenna, there are performance as to how large amplitude of a signal the amplifier can receive, as well as performance as to how much extent the amplifier can amplify a faint signal. When a signal of a large amplitude is input to the reception signal amplifying part 102, the gain of the amplifying part 102 is suppressed by short-circuiting the switch SW8, and thereby the large-amplitude input signal can be amplified without saturating the same.

Figure 16C:
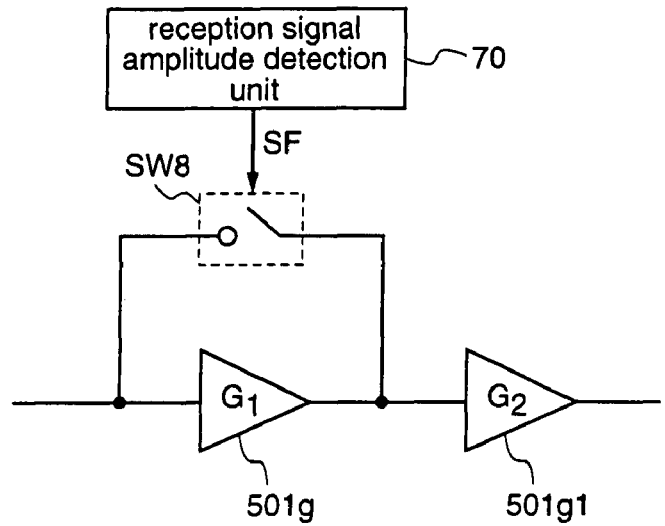
FIG. 16(c) is a diagram illustrating the high-frequency amplifier 501g as the second example of the sixth embodiment and a next-stage amplifier 501g1.

For example, as shown in FIG. 16(c), when a reception signal amplitude detection unit 70 detects that a large-amplitude reception signal is inputted, the switch SW8 is short-circuited, whereby the input signal bypasses the high-frequency amplifier 501g and is amplified only by the next-stage high-frequency amplifier 501g1, thereby the large-amplitude input signal can be amplified without saturation.

As described above, according to the sixth embodiment, since the bias voltage at the input side of the high-frequency amplifier is adjustable, a reduction in noise of the high-frequency amplifier can be realized by setting the bias voltage such that, during the reception mode, the reception signal amplifying part constituting the high-frequency amplifier is set in the normal operation state while the transmission signal amplifying part is set in the operation state that is almost close to the off state. Further, when a large-amplitude signal is inputted, the input signal is passed through the inside of the high-frequency amplifier, whereby saturation is avoided and performance of the high-frequency amplifier is enhanced. Further, a switch for short-circuiting the input of the high-frequency amplifier to the ground is provided, whereby reliable grounding of the input signal can be achieved.

While in the sixth embodiment the construction of the high-frequency amplifier body is identical to that shown in FIG. 8, it may be identical to any of those shown in FIGS. 2 and 6.

Embodiment 7

A seventh embodiment of the present invention is constituted such that input and output of a high-frequency amplifier can be performed by one terminal.

Figure 17A:
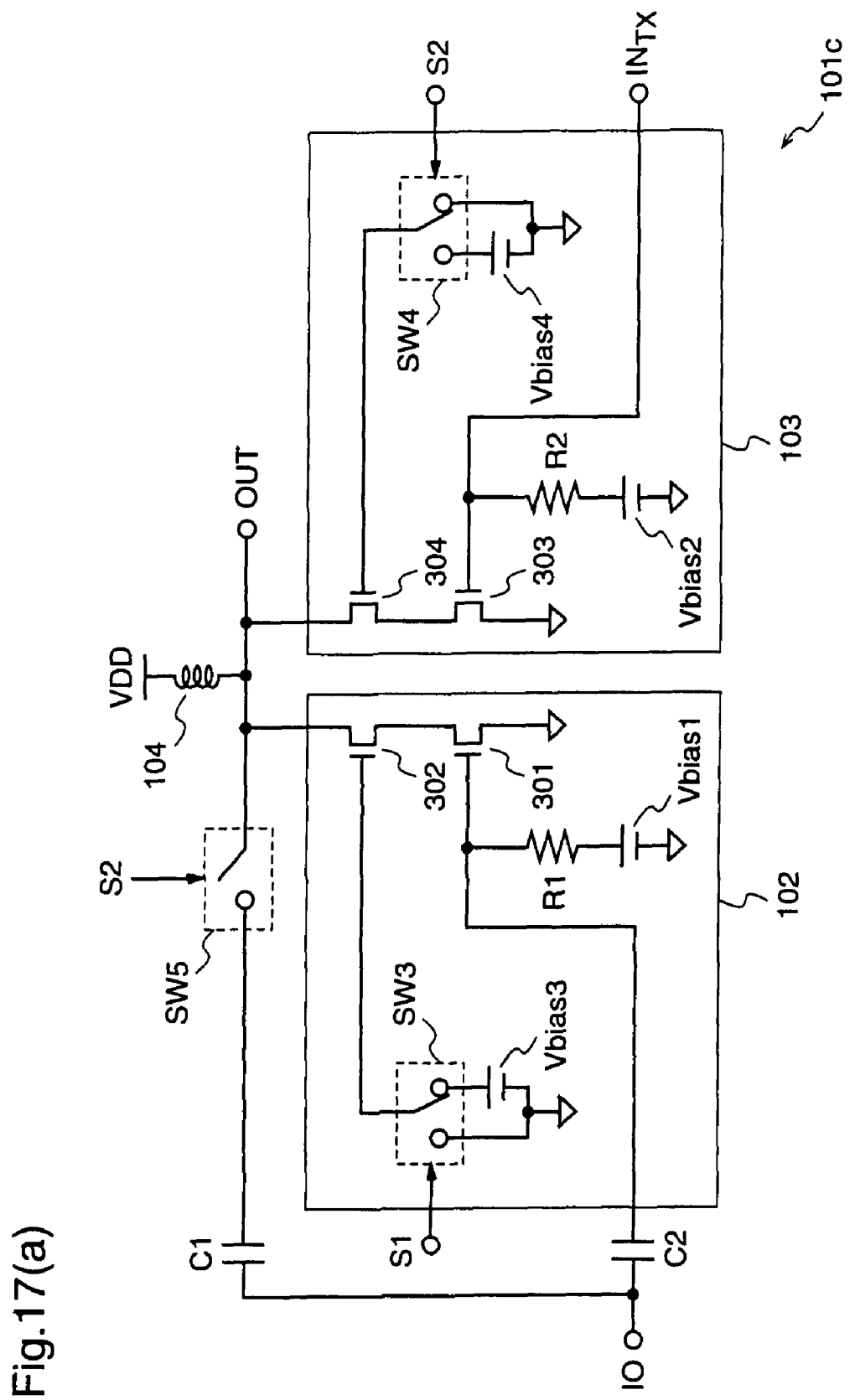
FIG. 17(a) is a diagram illustrating a high-frequency amplifier 101c as a first example of a seventh embodiment of the present invention.

FIG. 17(a) shows a first example of the high-frequency amplifier according to the seventh embodiment.

FIG. 17(a) shows a high-frequency amplifier 101c that is identical to the construction shown in FIG. 4 according to the first embodiment.

In the high-frequency amplifier shown in FIG. 17(a), when the switches SW3 and SW4 are placed to the ground side and the bias power supply side, respectively, according to the transmission/reception switching signals applied to the transmission/reception switching control terminals S1 and S2, the transistor 304 is turned on and the transistor 302 is turned off, whereby the transmission signal amplified by the transmission signal amplifying part 103 can be output to the IO terminal.

Inversely, when the switches SW3 and SW4 are placed to the bias power supply side and the ground side, respectively, the signal received by the reception signal amplifying part 102 can be inputted.

The node to which the output terminal $OUT_{TX}$ of the switch SW5 of the thus constituted high-frequency amplifier should be connected (i.e., the node on the opposite side from the spiral inductor 104), and the node to which the input terminal $IN_{RX}$ of the amplification transistor 301 should be connected (i.e., the gate node) are connected to the IO terminal via the capacitances C1 and C2, respectively, whereby the input and output terminals are unified.

In the high-frequency amplifier thus constituted, when amplifying the transmission signal, the switch SW4 of the transmission signal amplifying part 103 is set to the bias power supply side, and the switch SW5 is closed. Thereby, the transmission signal amplified by the transistor 303 is transmitted through the transistor 304, the switch SW5, and the capacitance C1 and outputted from the IO terminal to the outside.

At this time, the switch SW3 of the reception signal amplifying part 102 is set to the ground side. Therefore, even when the amplified transmission signal is input to the reception signal amplifying part 102 through the capacitance C2, since the transistor 302 is in the off state, overlapping with the amplified transmission signal does not occur.

Further, when amplifying the reception signal, the switch SW3 of the reception signal amplifier 102 is set to the bias power supply side, and the switch SW5 is opened. Thereby, the reception signal that is inputted from the IO terminal through the capacitance C2 is amplified by the transistor 301, and the amplified signal is outputted from the output terminal OUT through the transistor 302.

At this time, since the switch SW4 of the transmission signal amplifying part 103 is set to the ground side, the transistor 304 is in the off state even when the transmission signal is input to the transistor 303. Therefore, overlapping with the amplified reception signal does not occur.

Figure 17B:
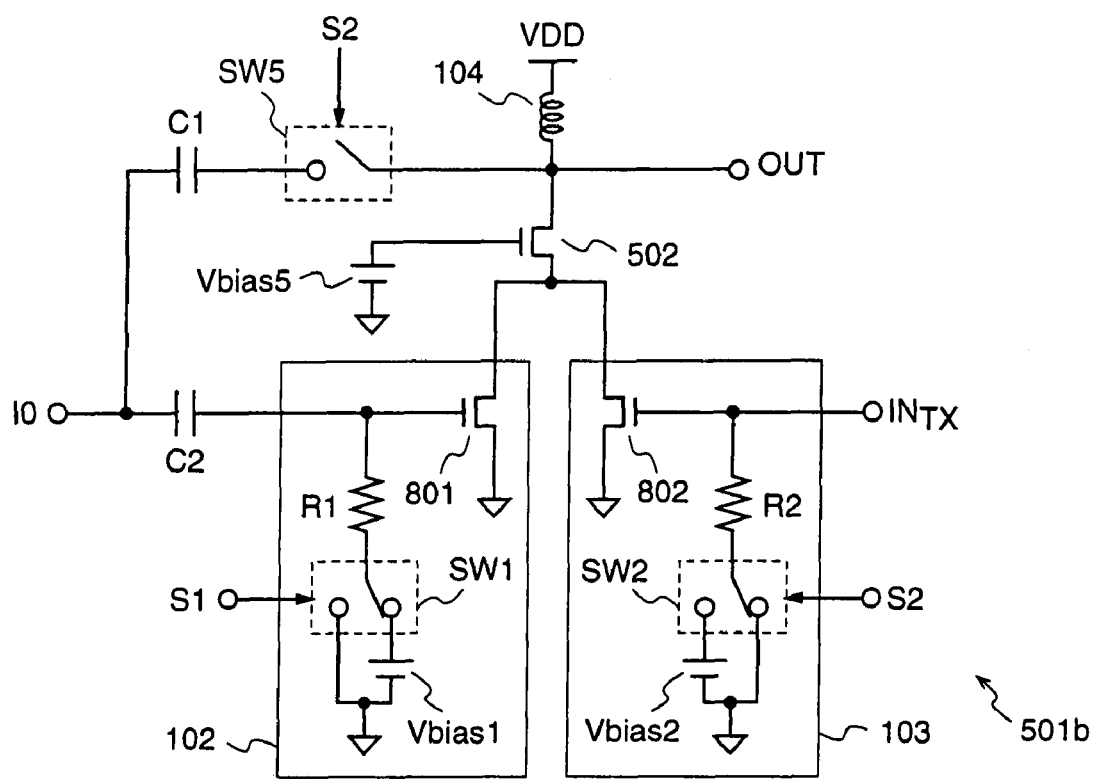
FIG. 17(b) is a diagram illustrating a high-frequency amplifier 501(b) as a second example of the seventh embodiment.

Further, FIG. 17(b) shows a second example of a high-frequency amplifier according to a seventh embodiment.

FIG. 17(b) has a high-frequency amplifier 501b which is identical to that shown in FIG. 8 according to the second embodiment.

However, like in FIG. 17(a), the node to which the output terminal $OUT_{TX}$ of the switch SW5 should be connected and the node to which the input terminal $IN_{RX}$ of the transistor 801 should be connected are connected to the IO terminal via the capacitances C1 and C2, respectively.

Since the high-frequency amplifier is constructed as described above, when the entire apparatus is constituted as an integrated circuit, the number of the terminals can be reduced by one, and the switch SW5 to be externally connected to the chip can be dispensed with.

As described above, according to the seventh embodiment, the output terminal for outputting the signal from the transmission signal amplifying part to the outside, and the input terminal for inputting the signal to the reception signal amplifying part are connected via a capacitance to consolidate the terminals as a common input/output terminal. Therefore, when the entire apparatus is constituted as an integrated circuit, one terminal can be dispensed with, thereby realizing cost reduction. Alternatively, the unnecessary terminal can be used for input/output of another signal.

While in this seventh embodiment the construction of the high-frequency amplifier body is identical to that shown in FIG. 4 or 8, it may be identical to any of those shown in FIGS. 13(b), 15(a), 15(b), 15(c), 16(a), and 16(b).

APPLICABILITY IN INDUSTRY

As described above, a high-frequency amplifier and a transmission/reception system according to the present invention can reduce an area to be occupied by inductors when these devices are mounted on an integrated circuit, and therefore, are effective in reducing production costs.

The invention claimed is:

1. A high-frequency amplifier including:
a reception signal amplifying part, a transmission signal amplifying part which is separate and distinct from the reception signal amplifying part, and an inductor;
said reception signal amplifying part having a reception signal input terminal, and a first transmission/reception switching control terminal;
said transmission signal amplifying part having a transmission signal input terminal, and a second transmission/ reception switching control terminal; and
a common output terminal to which an output of the reception signal amplifying part and an output of the transmission signal amplifying part are connected;
wherein, switching of operations of the reception signal amplifying part and the transmission signal amplifying part is carried out such that, during a reception mode, control signals are input to the first transmission/reception switching control terminal and to the second transmission/reception switching control terminal, whereby the transmission signal amplifying part is turned off, and the reception signal amplifying part is turned on to amplify a reception signal that is inputted from the reception signal input terminal, and
during a transmission mode, control signals are input to the first transmission/reception switching control terminal and to the second transmission/reception switching control terminal, whereby the reception signal amplifying part is turned off, and the transmission signal amplifying part is turned on to amplify a transmission signal that is inputted from the transmission signal input terminal; and
said inductor is connected between a DC power supply terminal and the common output terminal as a load that is common to the reception signal amplifying part and the transmission signal amplifying part.

2. A high-frequency amplifier as defined in claim 1 further including a switch and a transmission signal output terminal, wherein
said switch is connected between the output terminal and the transmission signal output terminal;
during the reception mode, said switch is turned off, whereby the reception signal inputted from the reception signal input terminal is amplified and transmitted to the output terminal; and
during the transmission mode, said switch is turned on, whereby the transmission signal inputted form the transmission signal input terminal is amplified and transmitted to the transmission signal output terminal.

3. A high-frequency amplifier as defined in claim 1 wherein said reception signal amplifying part has a transistor for amplifying the reception signal.

4. A high-frequency amplifier as defined in claim 3 wherein said transistor of said reception signal amplifying part is optimized to realize noise matching.

5. A high-frequency amplifier as defined in claim 3 wherein said transistor of said reception signal amplifying part is optimized to realize gain matching.

6. A high-frequency amplifier as defined in claim 1 wherein said transmission signal amplifying part has a transistor for amplifying power.

7. A high-frequency amplifier as defined in claim 1 wherein said inductor comprises a spiral inductor that is mounted in an integrated circuit.

8. A high-frequency amplifier as defined in claim 1 wherein said reception signal amplifying part, said transmission signal amplifying part, and said inductor are mounted on the same integrated circuit.

9. A high-frequency amplifier as defined in claim 1 wherein said inductor comprises a spiral inductor that is mounted in a module.

10. A high-frequency amplifier comprising two pieces of high-frequency amplifiers defined in claim 1, and amplifying a differential reception signal and a differential transmission signal.

11. A high-frequency amplifier as defined in claim 1 wherein
each of transistors constituting the high-frequency amplifier is any of a MOSFET, a MESFET, a JFET, a HEMT, a bipolar junction transistor, and a heterojunction transistor, or a combination of some of these transistors.

12. A high-frequency amplifier as defined in claim 1 wherein each of transistors constituting the high-frequency amplifier comprises any of silicon, silicon-germanium, and III-V compound semiconductor.

13. A high-frequency amplifier as defined in claim 1 wherein
said reception signal amplifying part has a transistor for amplifying the reception signal, and a first variable voltage supply that can vary a voltage applied between a gate of the transistor and the ground;
said transmission signal amplifying part has a transistor for amplifying power, and a second variable voltage supply that can vary a voltage applied to a gate of the transistor and the ground;
said first transmission/reception switching control terminal is connected to the first variable voltage supply;
said second transmission/reception switching control terminal is connected to the second variable voltage supply;
during the reception mode, control signals are input to the first transmission/reception switching control terminal and to the second transmission/reception switching control terminal, whereby the transmission signal amplifying part is almost turned off, and the reception signal amplifying part is turned on to amplify the reception signal inputted from the reception signal input terminal at low noise.

14. A high-frequency amplifier as defined in claim 1 including
a switch disposed between the output terminal and the reception signal input terminal, and
said switch being turned on when the reception signal has a large amplitude.

15. A high-frequency amplifier as defined in claim 1 wherein
when a capacitance that is required between the output terminal and the ground by the high-frequency amplifier is deficient due to a parasitic capacitance at the output terminal, a capacitance having a capacitance value corresponding to the deficit is connected.

16. A high-frequency amplifier as defined in claim 1 including
switches disposed between the reception signal input terminal, the transmission signal input terminal and the ground, respectively, and
the switch which is disposed at the side where the reception signal amplifying part or the transmission signal amplifying part is turned off, is turned on.

17. A high-frequency amplifier as defined in claim 1 further including a switch, an input/output terminal, and first and second capacitances, wherein
a series-connected body comprising said switch and said first capacitance is connected between a node to which the output terminal is connected, and the input/output terminal;
said input/output terminal is connected through the second capacitance to a node to which the transmission signal input terminal should be connected;
during the reception mode, said switch is turned off, and the reception signal inputted to the input/output terminal is amplified and transmitted to the output terminal; and
during the transmission mode, said switch is turned on, and the transmission signal inputted from the transmission signal input terminal is amplified and transmitted to the input/output terminal.

18. A transmission/reception system including a transmission/reception unit for transmitting and receiving a high-frequency signal,
said system including a high-frequency amplifier as defined in claim 1, and operating in a time-division duplex communication scheme.

19. A transmission/reception system having a transmission/reception unit for transmitting and receiving a high-frequency signal,
said system including a plurality of high-frequency amplifiers as defined in claim 1, and
being able to set whether said plural high-frequency amplifiers are simultaneously switching between the transmission mode and the reception mode, or some of them are in the transmission mode while the others are in the reception mode.

20. A high-frequency amplifier including a reception signal amplifying part, a transmission signal amplifying part which is separate and distinct from the reception signal amplifying part, an inductor, and a transistor, wherein:
said reception signal amplifying part has a reception signal input terminal, and a first transmission/reception switching control terminal;
said transmission signal amplifying part has a transmission signal input terminal, and a second transmission/reception switching control terminal;
an output of the reception signal amplifying part and an output of the transmission signal amplifying part are connected to the transistor;
switching of operations of the reception signal amplifying part and the transmission signal amplifying part is carried out such that, during a reception mode, control signals are input to the first transmission/reception switching control terminal and to the second transmission/reception switching control terminal, whereby the transmission signal amplifying part is turned off, and the reception signal amplifying part is turned on to amplify a reception signal that is inputted from the reception signal input terminal, and
during a transmission mode, control signals are input to the first transmission/reception switching control terminal and to the second transmission/reception switching control terminal, whereby the reception signal amplifying part is turned off, and the transmission signal amplifying part is turned on to amplify a transmission signal that is inputted from the transmission signal input terminal;
said inductor is connected between a DC power supply terminal and the transistor as a load that is common to the reception signal amplifying part and the transmission signal amplifying part; and
an output terminal is provided at a connection point of the inductor and the transistor.

* * * * *